(12) United States Patent
Tomita et al.

(10) Patent No.: US 9,391,035 B2
(45) Date of Patent: Jul. 12, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Kazuo Tomita, Kanagawa (JP); Hiroki Takewaka, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/685,886

(22) Filed: Apr. 14, 2015

(65) Prior Publication Data

US 2015/0294947 A1 Oct. 15, 2015

(30) Foreign Application Priority Data

Apr. 14, 2014 (JP) ................... 2014-082804

(51) Int. Cl.
*H01L 23/48* (2006.01)
*H01L 23/00* (2006.01)
*H01L 21/66* (2006.01)
*H01L 23/31* (2006.01)

(52) U.S. Cl.
CPC ............... *H01L 24/09* (2013.01); *H01L 24/03* (2013.01); *H01L 24/05* (2013.01); *H01L 24/06* (2013.01); *H01L 24/46* (2013.01); *H01L 22/32* (2013.01); *H01L 23/3114* (2013.01); *H01L 23/3192* (2013.01); *H01L 23/562* (2013.01); *H01L 24/02* (2013.01); *H01L 2224/02166* (2013.01); *H01L 2224/04042* (2013.01); *H01L 2224/05552* (2013.01); *H01L 2224/05553* (2013.01); *H01L 2224/05567* (2013.01); *H01L 2224/06155* (2013.01); *H01L 2224/48091* (2013.01); *H01L 2224/48247* (2013.01); *H01L 2224/4905* (2013.01); *H01L 2924/13091* (2013.01); *H01L 2924/181* (2013.01)

(58) Field of Classification Search
CPC .............................. H01L 23/562; H01L 21/09
See application file for complete search history.

(56) References Cited

U.S. PATENT DOCUMENTS

| | | | |
|---|---|---|---|
| 5,661,082 A * | 8/1997 | Hsu et al. | 438/612 |
| 5,814,893 A | 9/1998 | Hsu et al. | |
| 5,925,935 A | 7/1999 | Kim | |
| 2004/0053483 A1* | 3/2004 | Nair et al. | 438/540 |
| 2007/0205508 A1 | 9/2007 | Hsia et al. | |
| 2010/0295043 A1 | 11/2010 | Yasumura et al. | |

FOREIGN PATENT DOCUMENTS

| | | | |
|---|---|---|---|
| JP | 01-298731 A | 12/1989 | |
| JP | 03-160722 A | 7/1991 | |
| JP | 08-241909 A | 9/1996 | |
| JP | 2001-264391 A | 9/2001 | |
| JP | 2003-060051 A | 2/2003 | |
| JP | 2008-066654 A1 | 3/2008 | |

OTHER PUBLICATIONS

Extended European Search Report issued Oct. 9, 2015, in European Patent Application No. 15163270.0.

* cited by examiner

*Primary Examiner* — William Harriston
(74) *Attorney, Agent, or Firm* — Shapiro, Gabor and Rosenberger, PLLC

(57) ABSTRACT

A semiconductor device with improved reliability is provided. The semiconductor device is characterized by its embodiments in that sloped portions are formed on connection parts between a pad and a lead-out wiring portion, respectively. This feature suppresses crack formation in a coating area where a part of the pad is covered with a surface protective film.

17 Claims, 30 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. 2014-082804 filed on Apr. 14, 2014, the content of which is hereby incorporated by reference into this application.

TECHNICAL FIELD OF THE INVENTION

The present invention relates to a semiconductor device and a method of manufacturing the same, and to, for example, a technique applied effectively to a semiconductor device having pads and a method of manufacturing the same.

BACKGROUND OF THE INVENTION

Japanese Laid-Open Patent Publication No. H8-241909 (patent document 1) describes a technique by which the coating area of a surface protective film that covers a side closest to an edge side of a semiconductor chip, among a plurality of sides making up a pad, is made larger than the coating area of the surface protective film covering the other sides.

SUMMARY OF THE INVENTION

For example, most of the surface of a pad formed on a semiconductor chip is exposed through an opening provided on a surface protective film. The edge of the pad, on the other hand, is covered with the surface protective film. Specifically, on the edge of the pad, the surface protective film is so formed as to cover a step that is caused by the thickness of the pad.

A crack may be generated on the surface protective film covering the step formed on the edge of the pad due to a stress applied upon dicing a semiconductor chip into pieces and a stress applied by a sealing body sealing the semiconductor chip. The conventional semiconductor device, therefore, should be improved further in view of the necessity of suppressing the formation of a crack on the surface protective film covering the step formed on the edge of the pad to improve the reliability of the semiconductor device.

Other problems and novel features will be clearly understood by referring to the descriptive contents of this specification and the accompanying drawings.

A semiconductor device according to one embodiment includes a rectangular semiconductor chip, which has a sloped portion provided in a connecting part between each of a plurality of pads and a lead-out wiring portion.

According to one embodiment, the reliability of the semiconductor device can be improved.

BRIEF DESCRIPTIONS OF THE DRAWINGS

Figure 1:
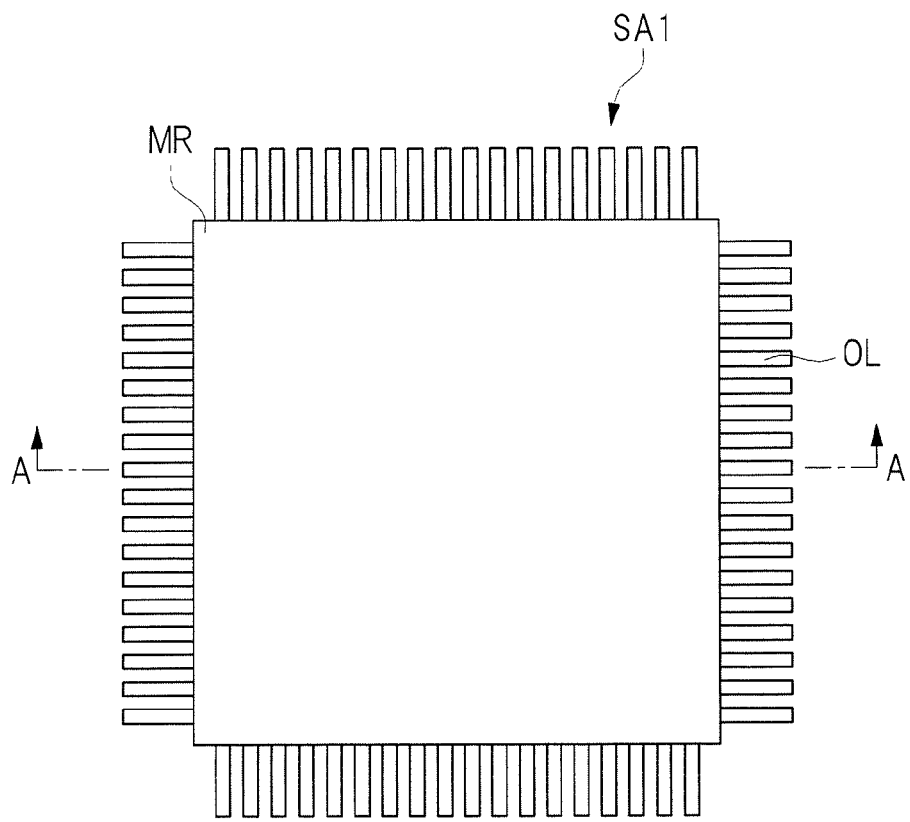
Figure 2:
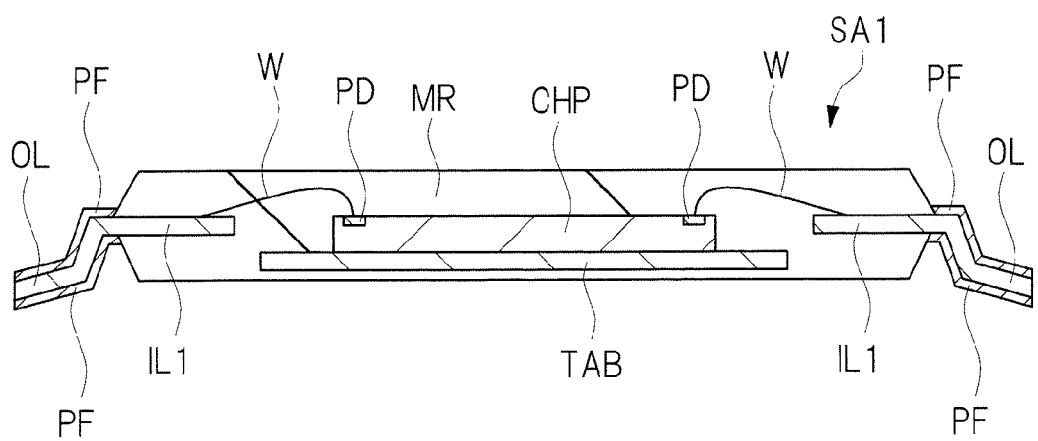
Figure 3:
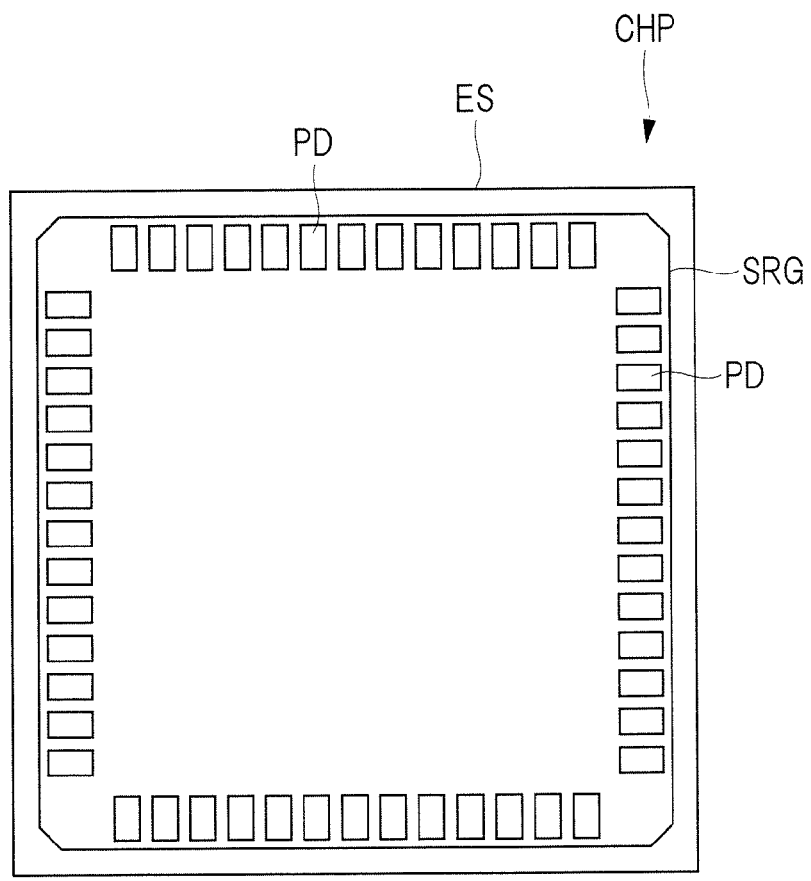
Figure 4:
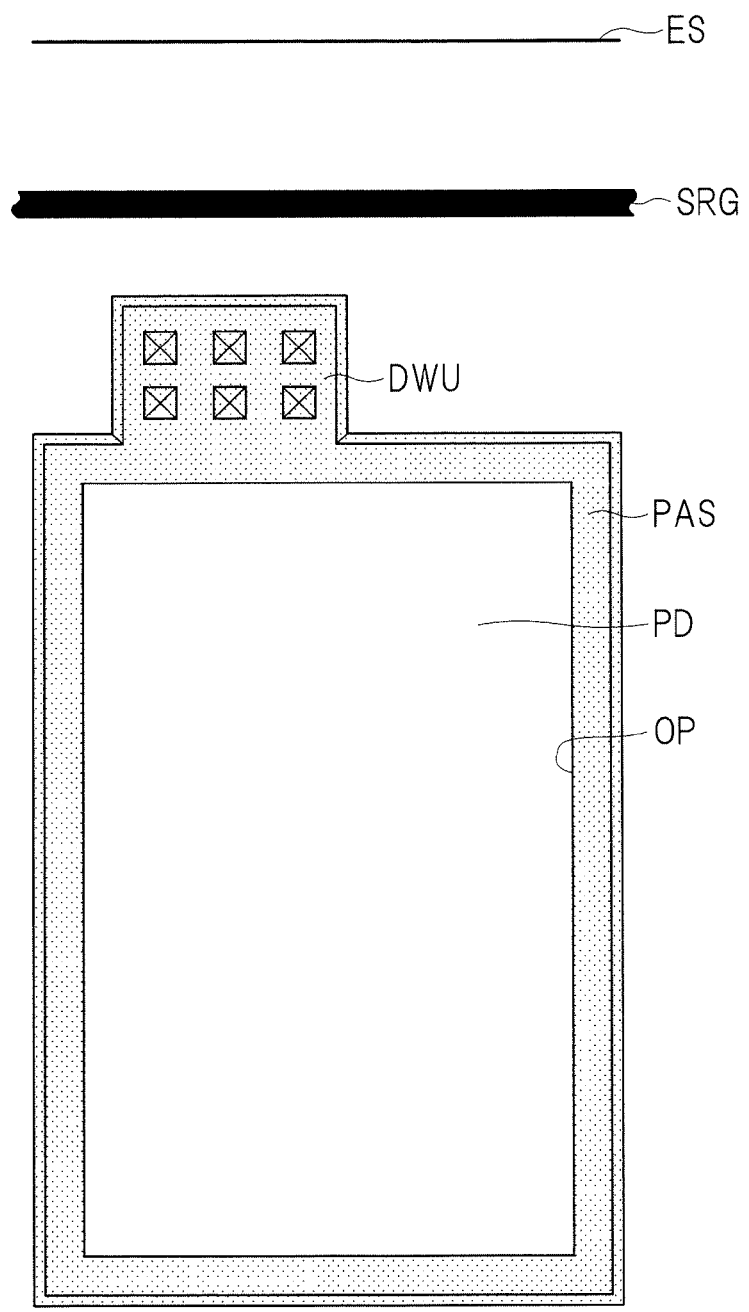
Figure 5:
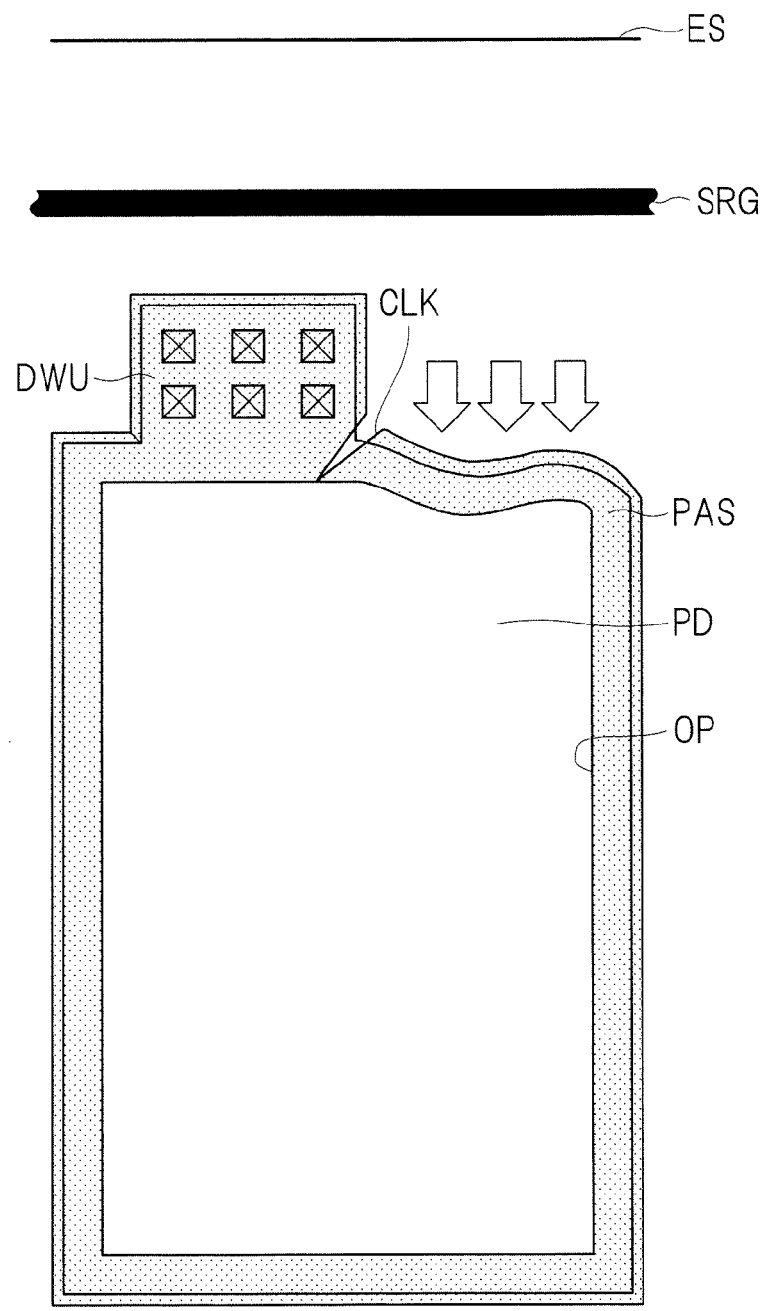
Figure 6:
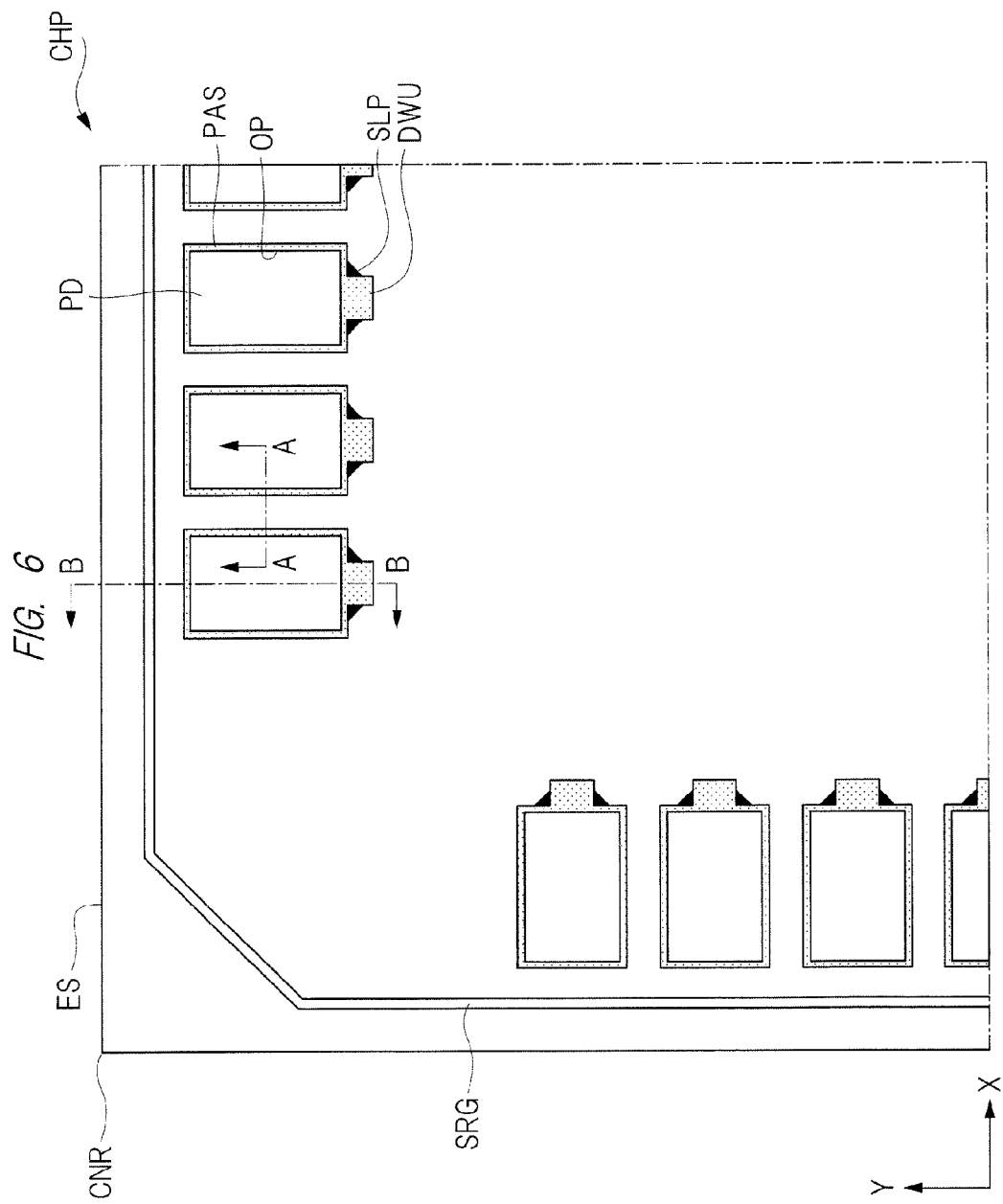
Figure 7:
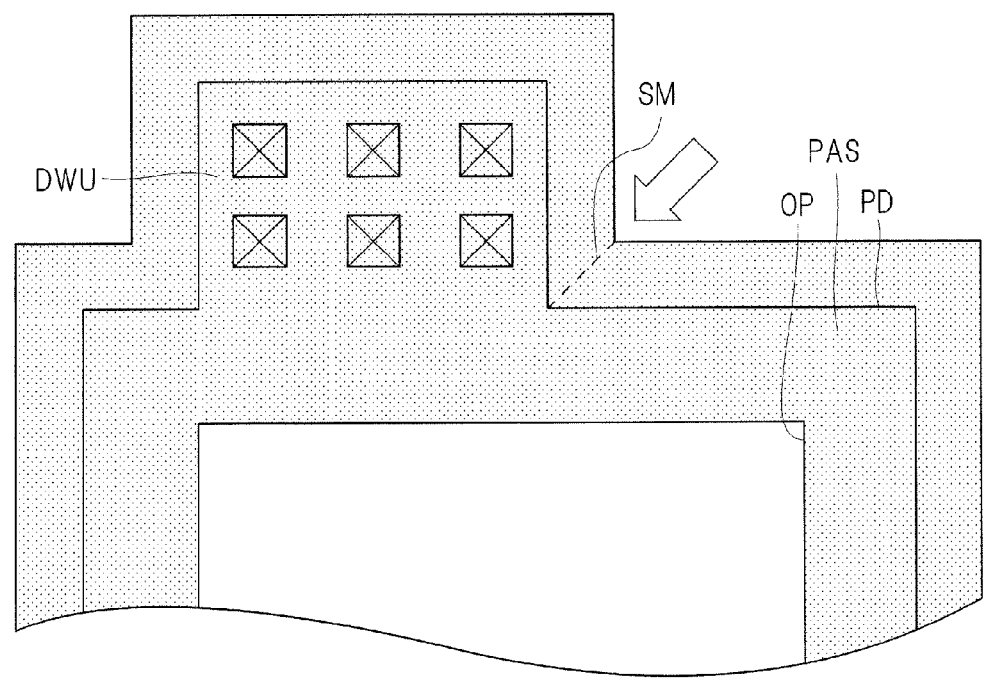
Figure 8:
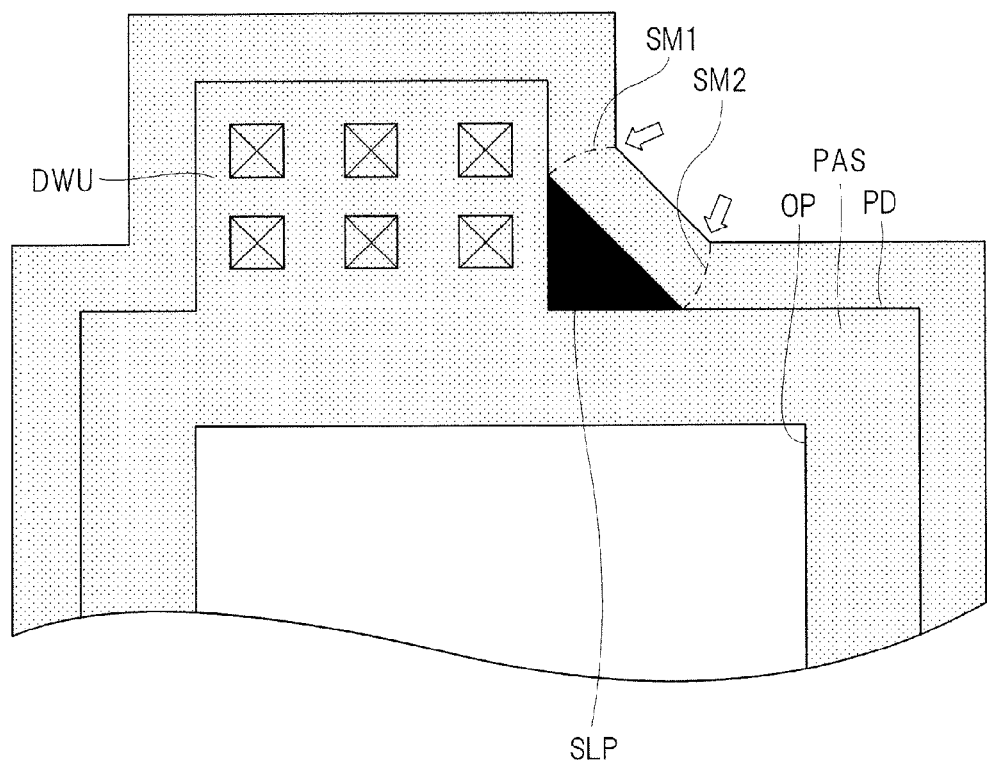
Figure 9:
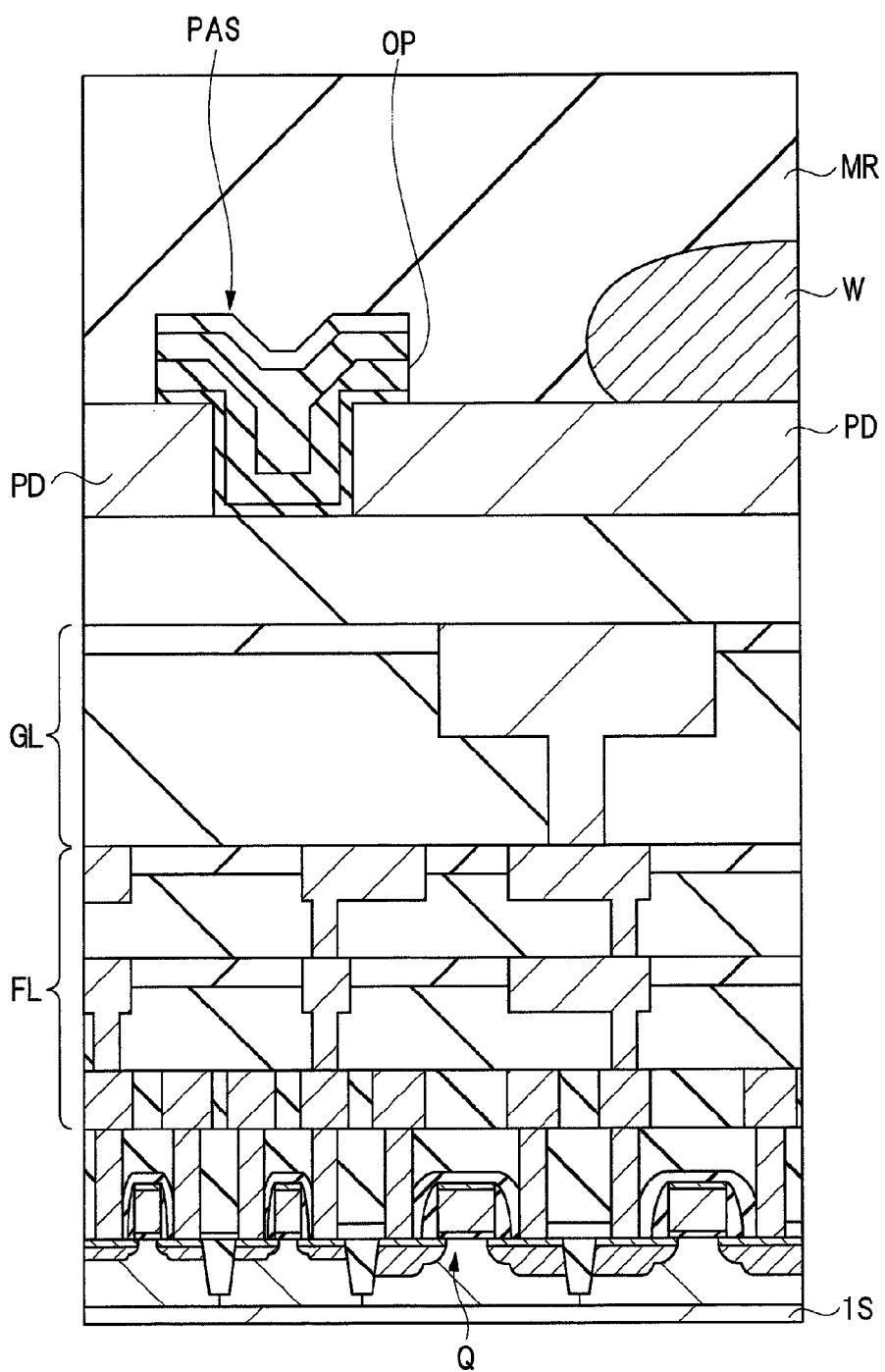
Figure 10:
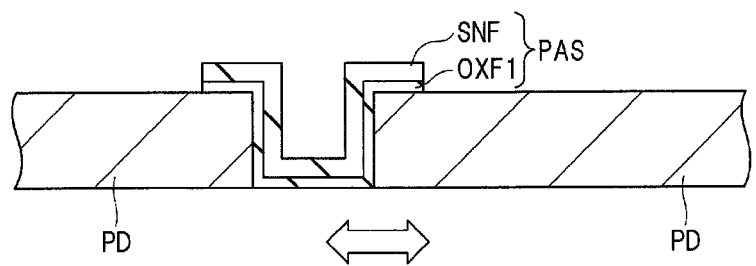
Figure 11:
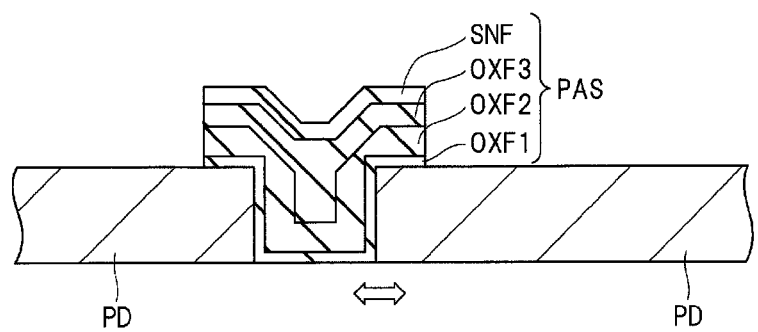
Figure 12:
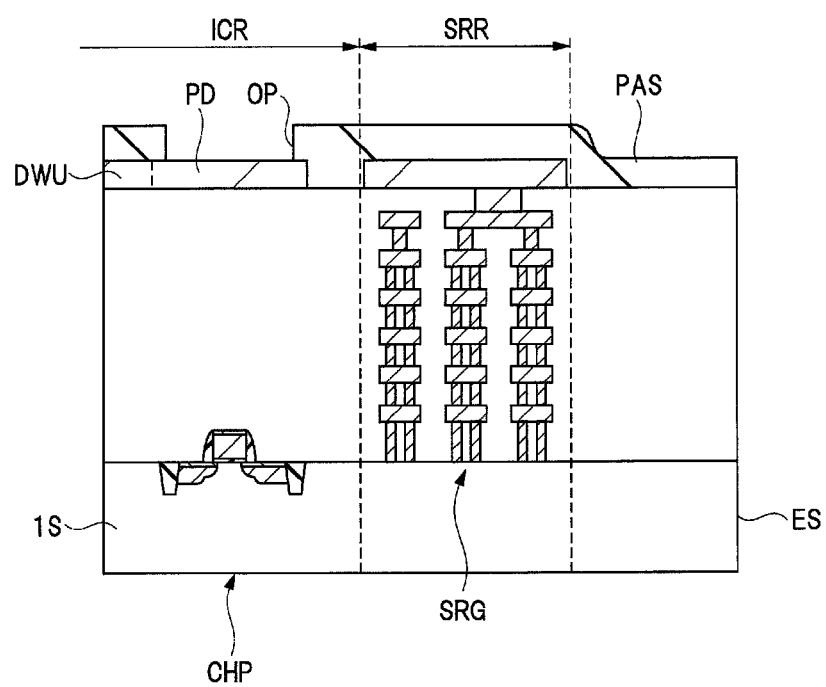
Figure 13:
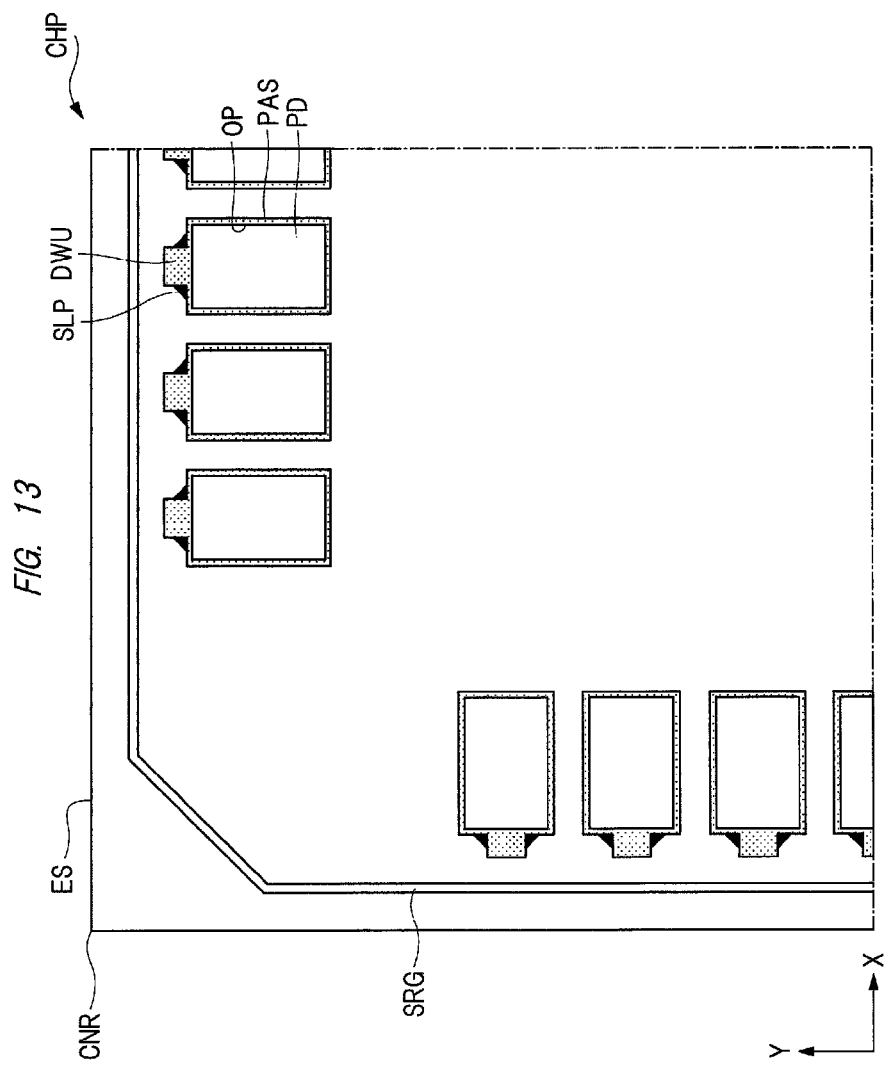
Figure 14:
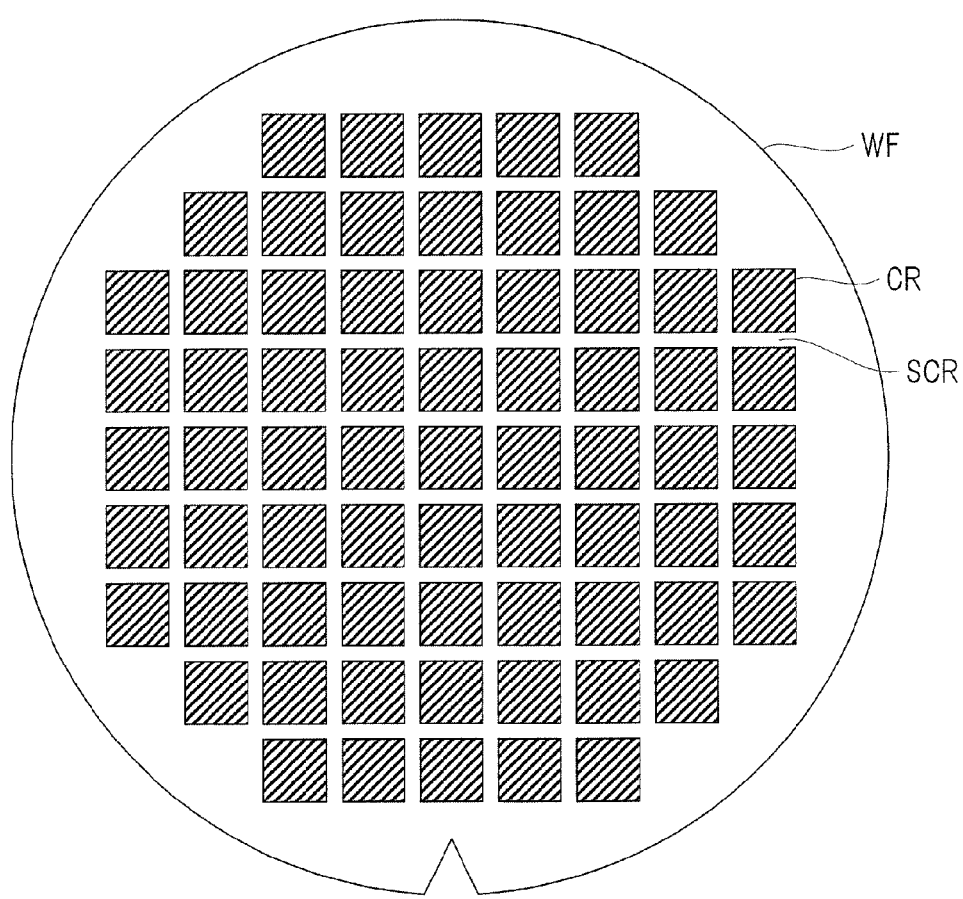
Figure 15:
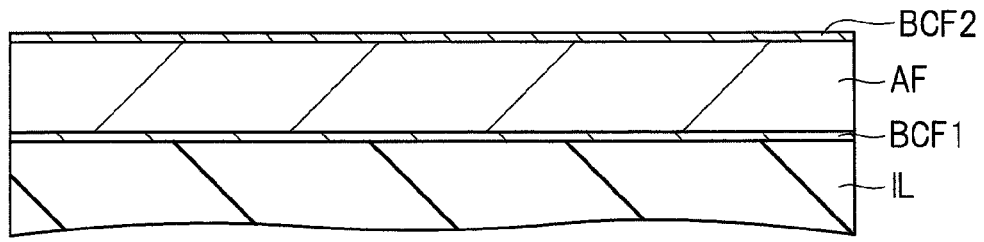
Figure 16A:
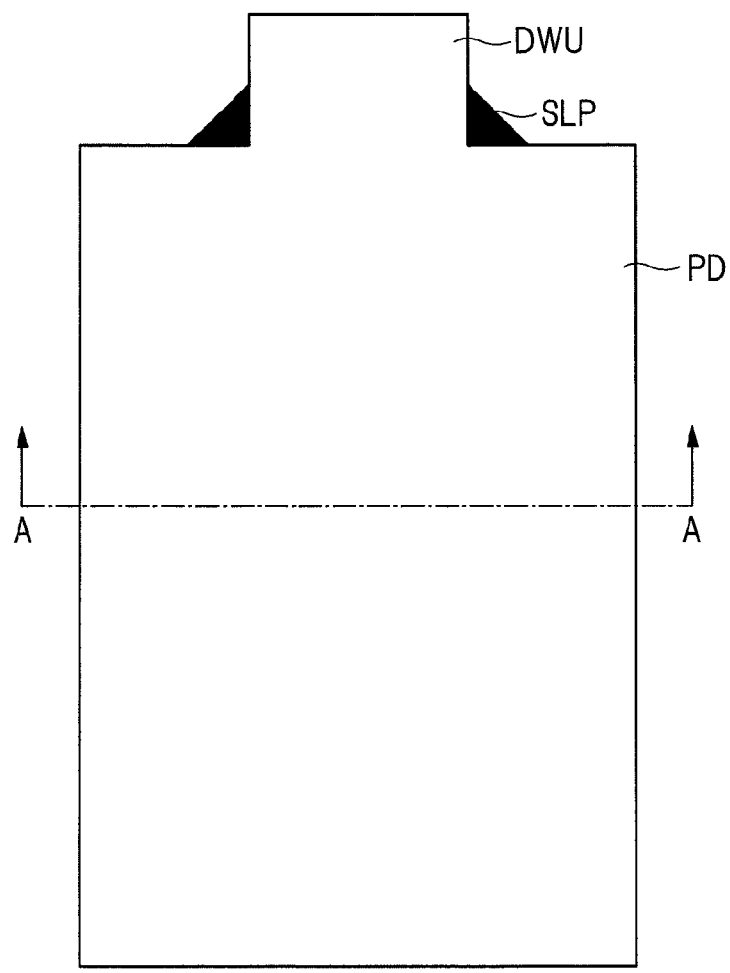
Figure 16B:
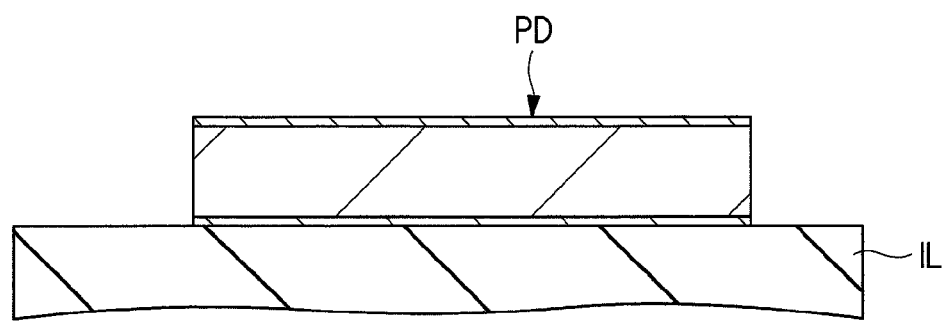
Figure 17A:
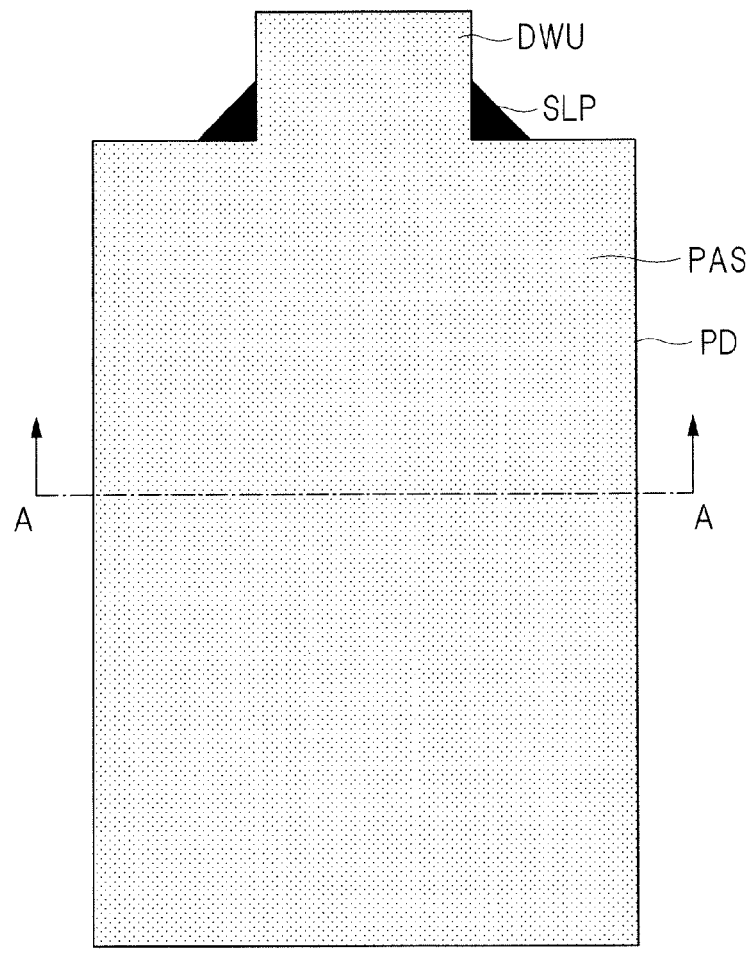
Figure 17B:
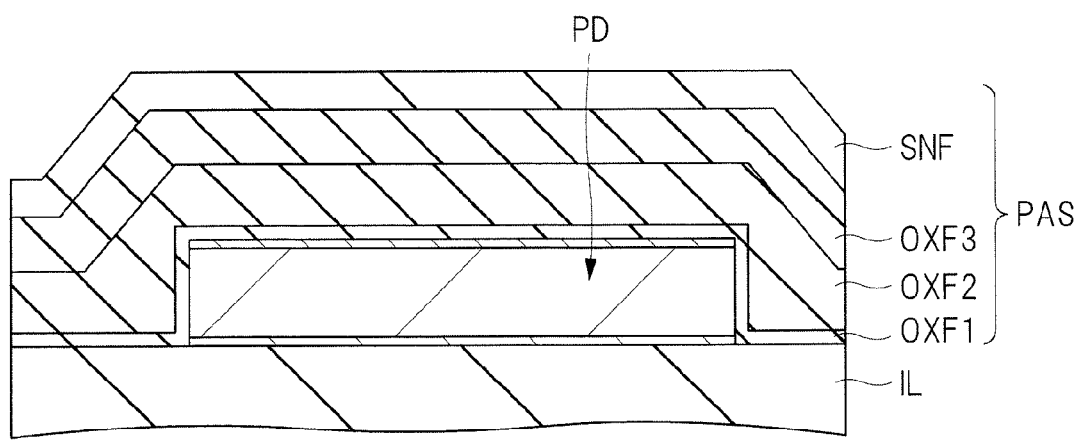
Figure 18A:
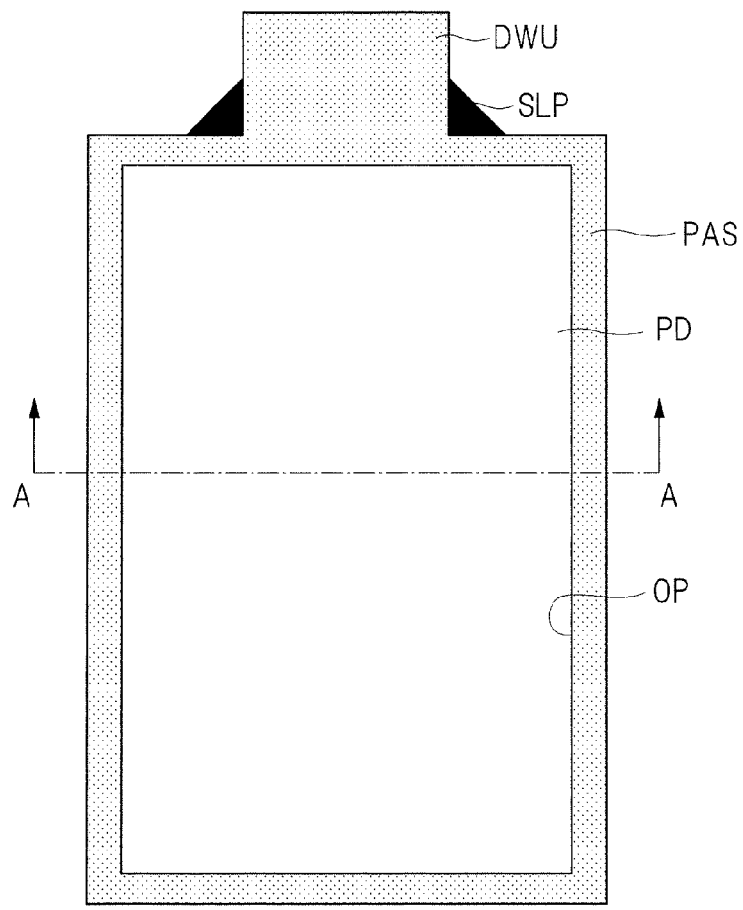
Figure 18B:
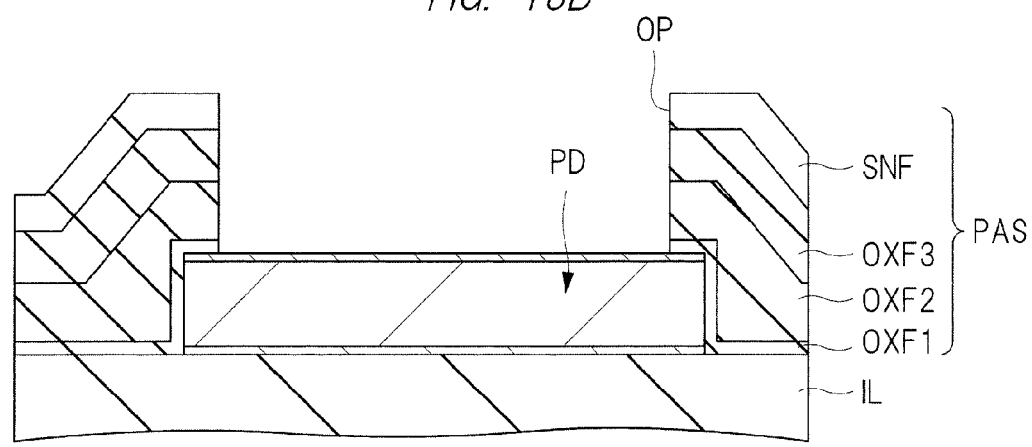
Figure 19A:
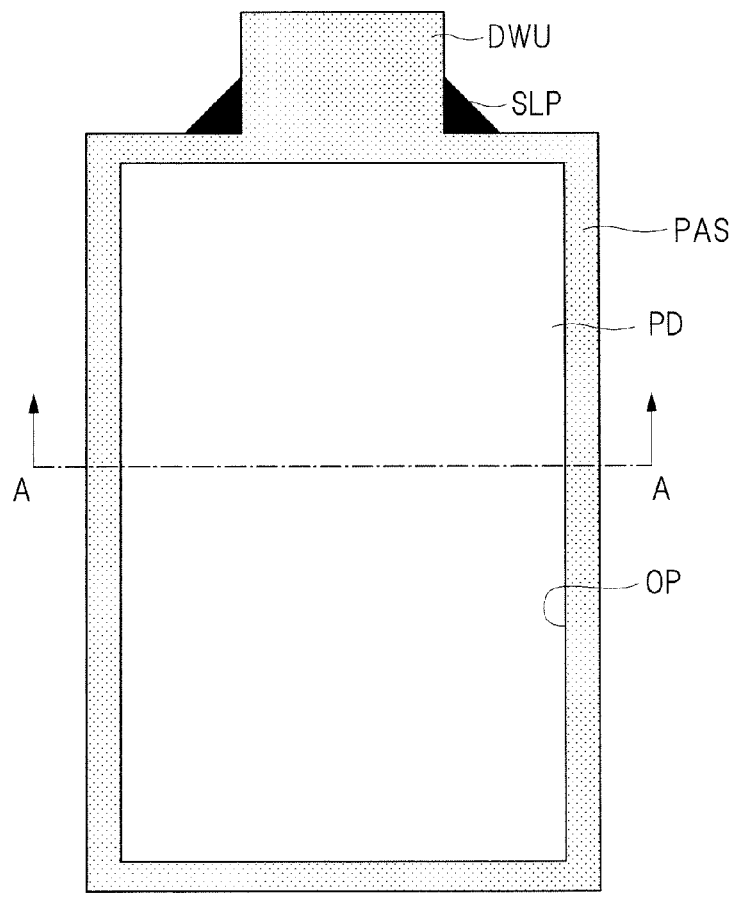
Figure 19B:
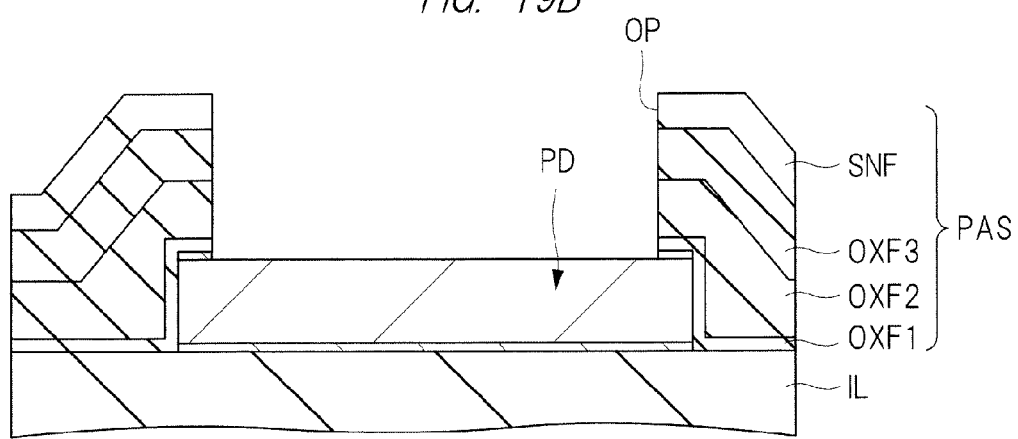
Figure 20:
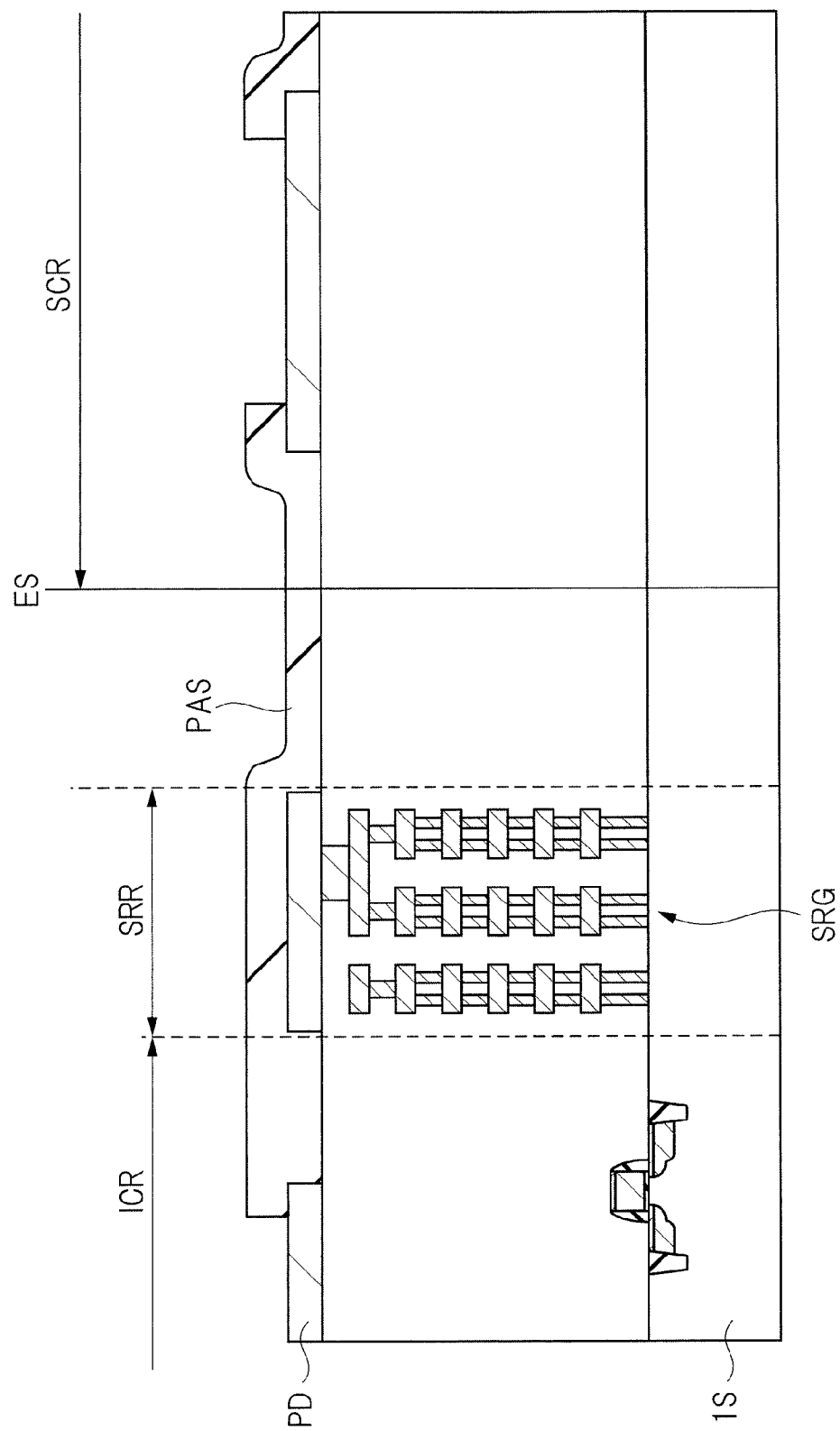
Figure 21:
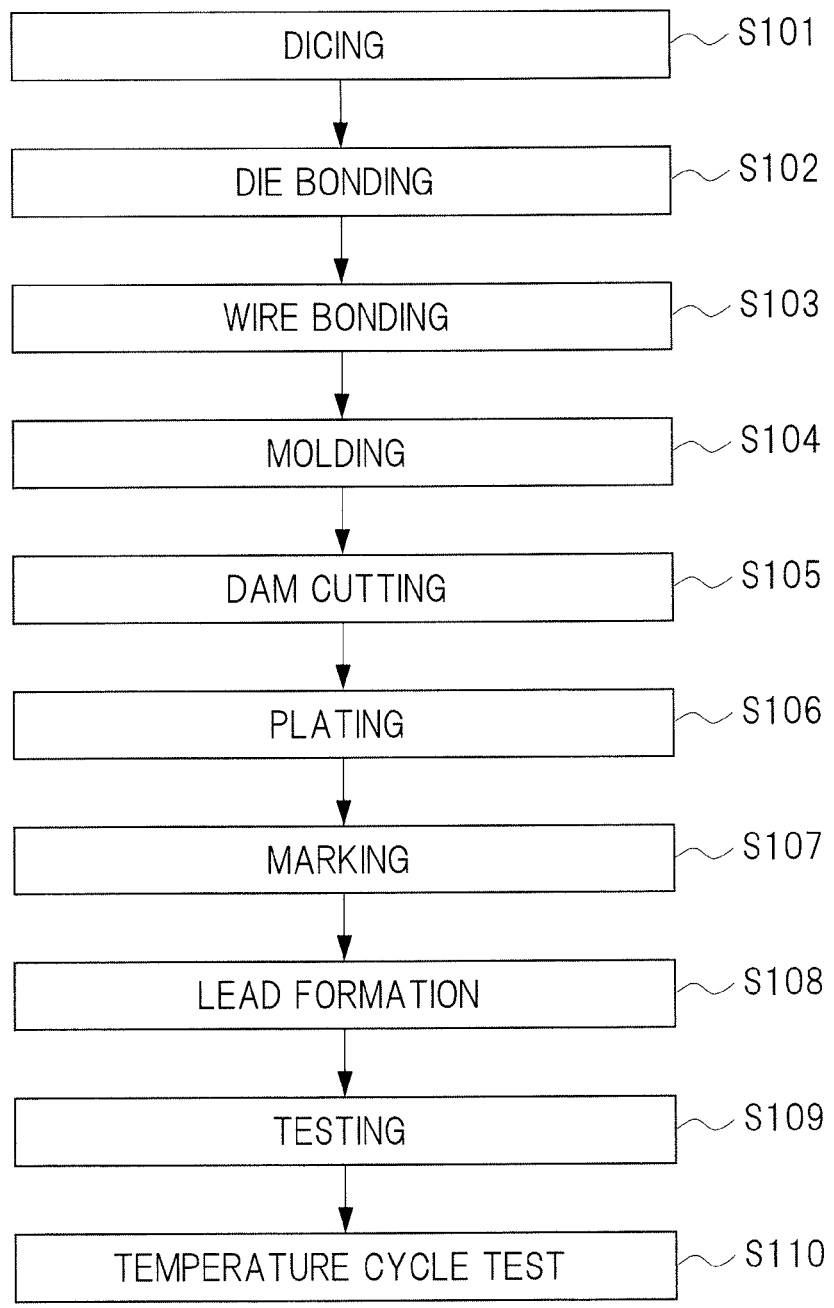
Figure 22:
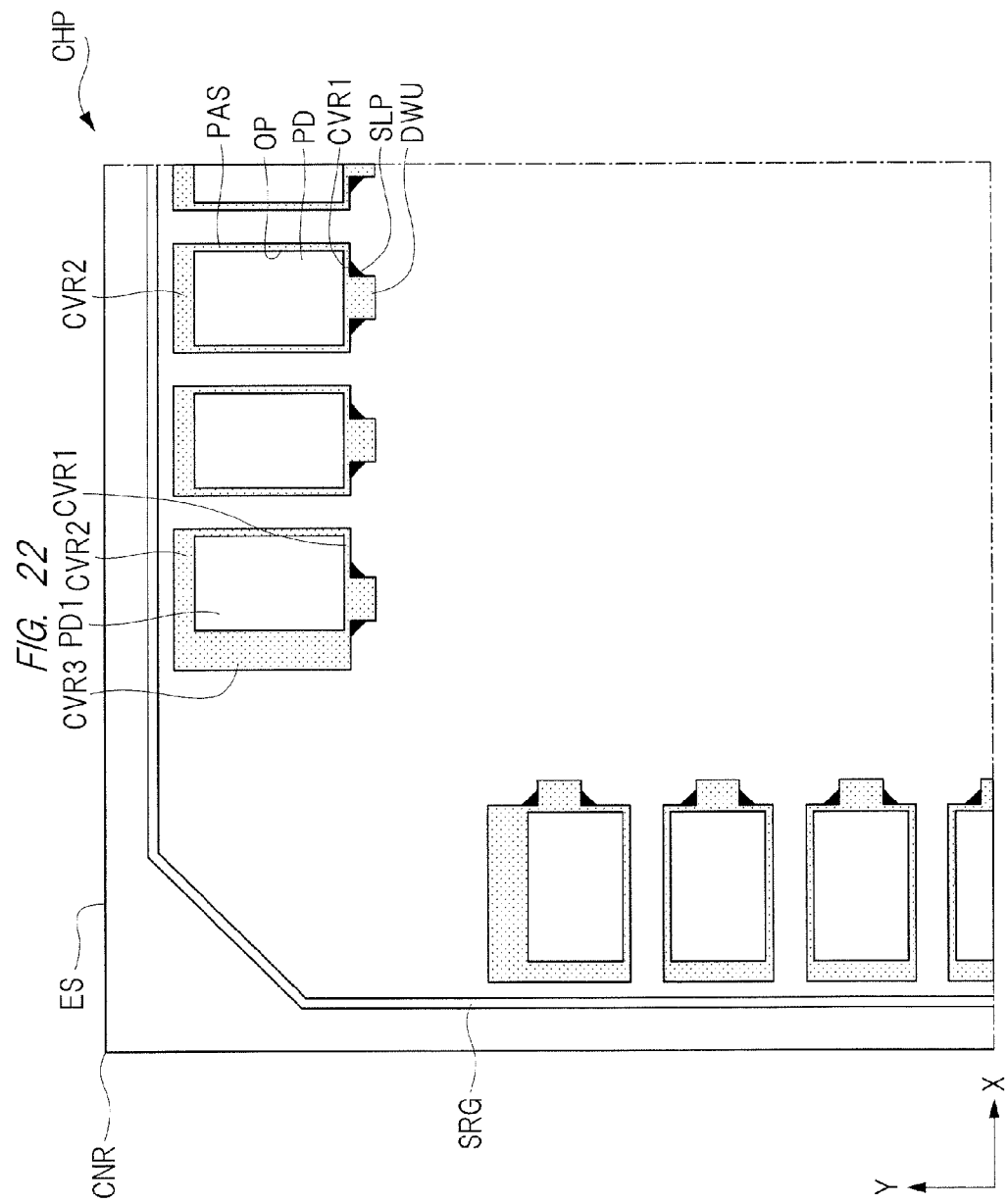
Figure 23:
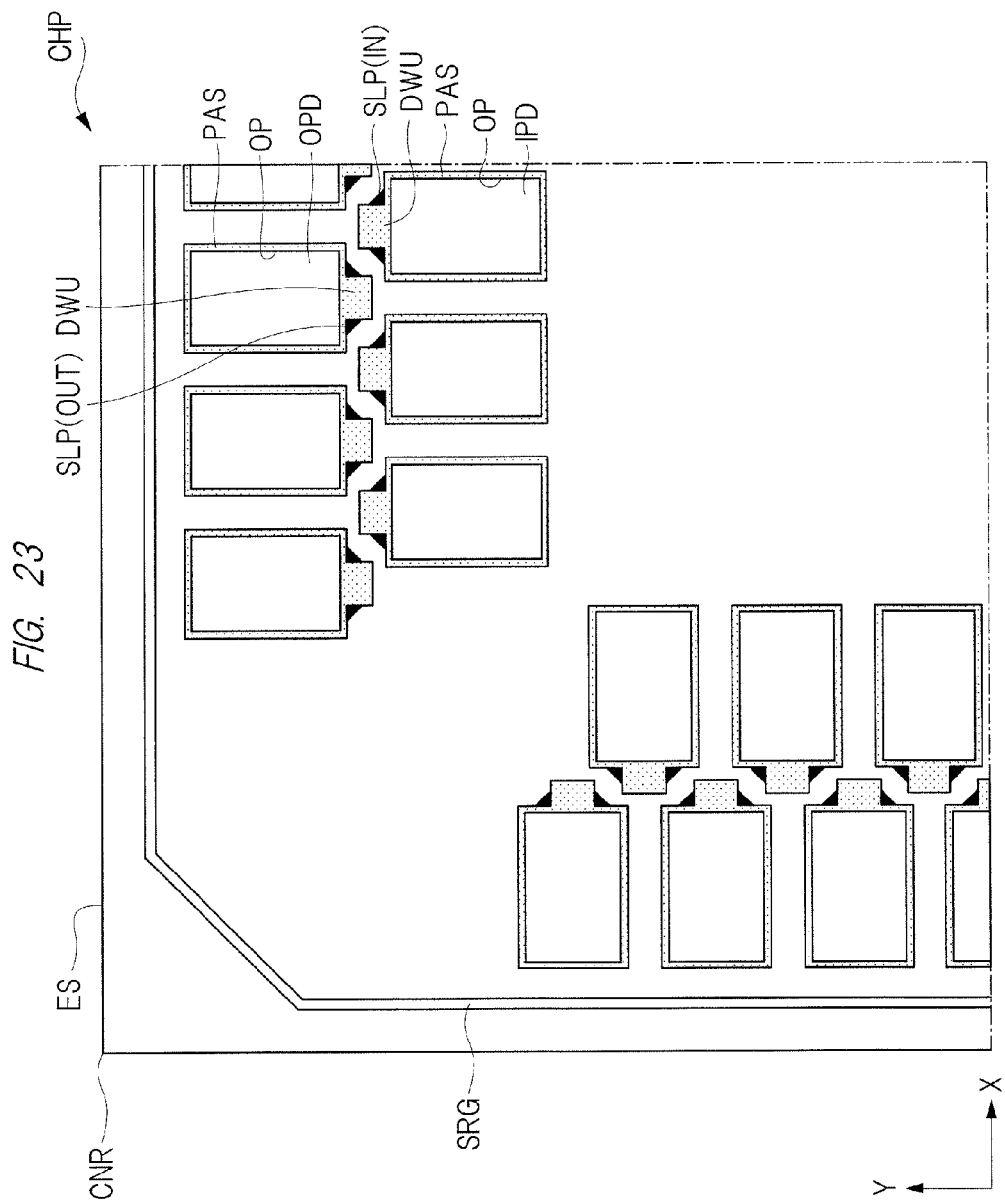
Figure 24:
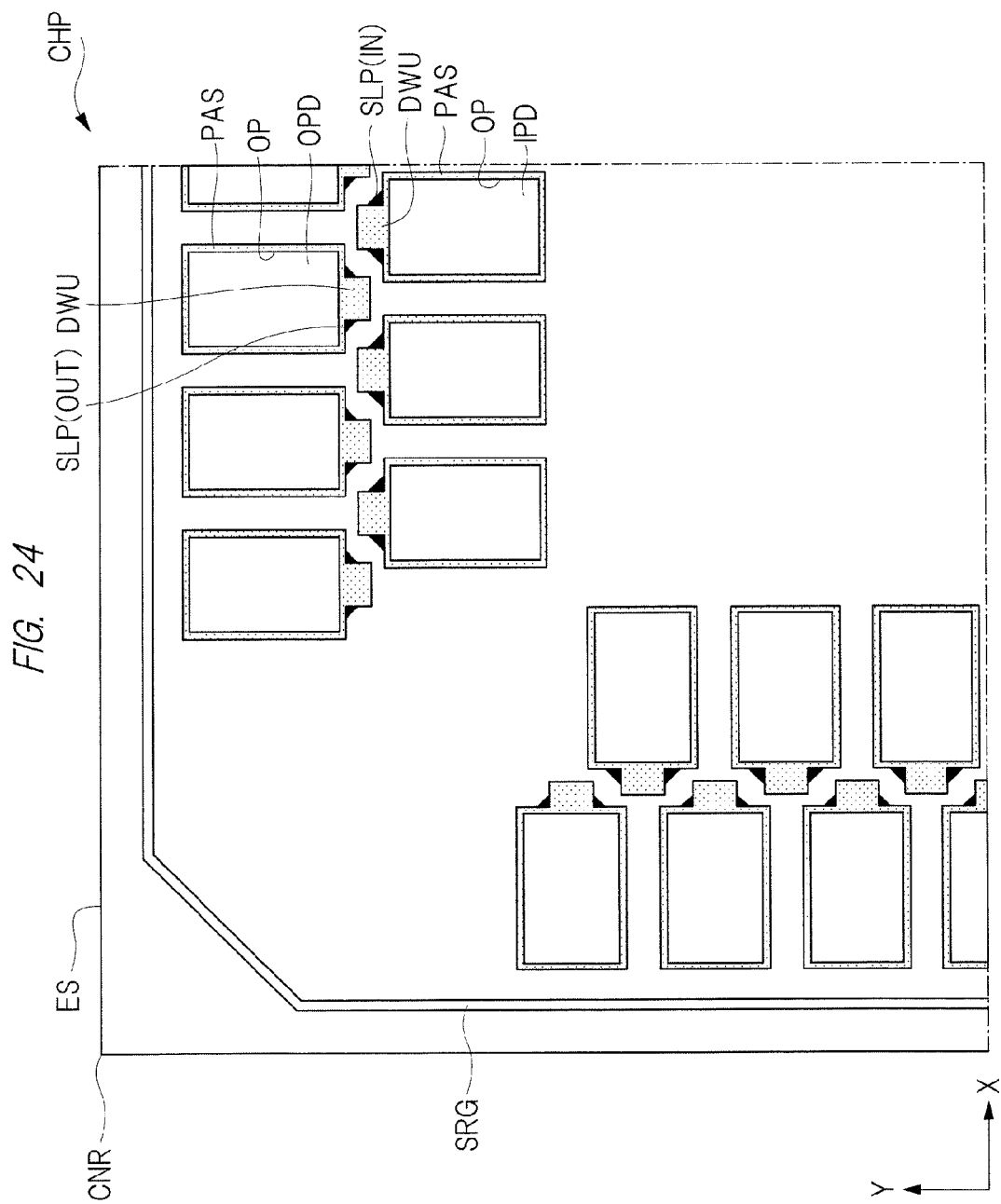
Figure 25:
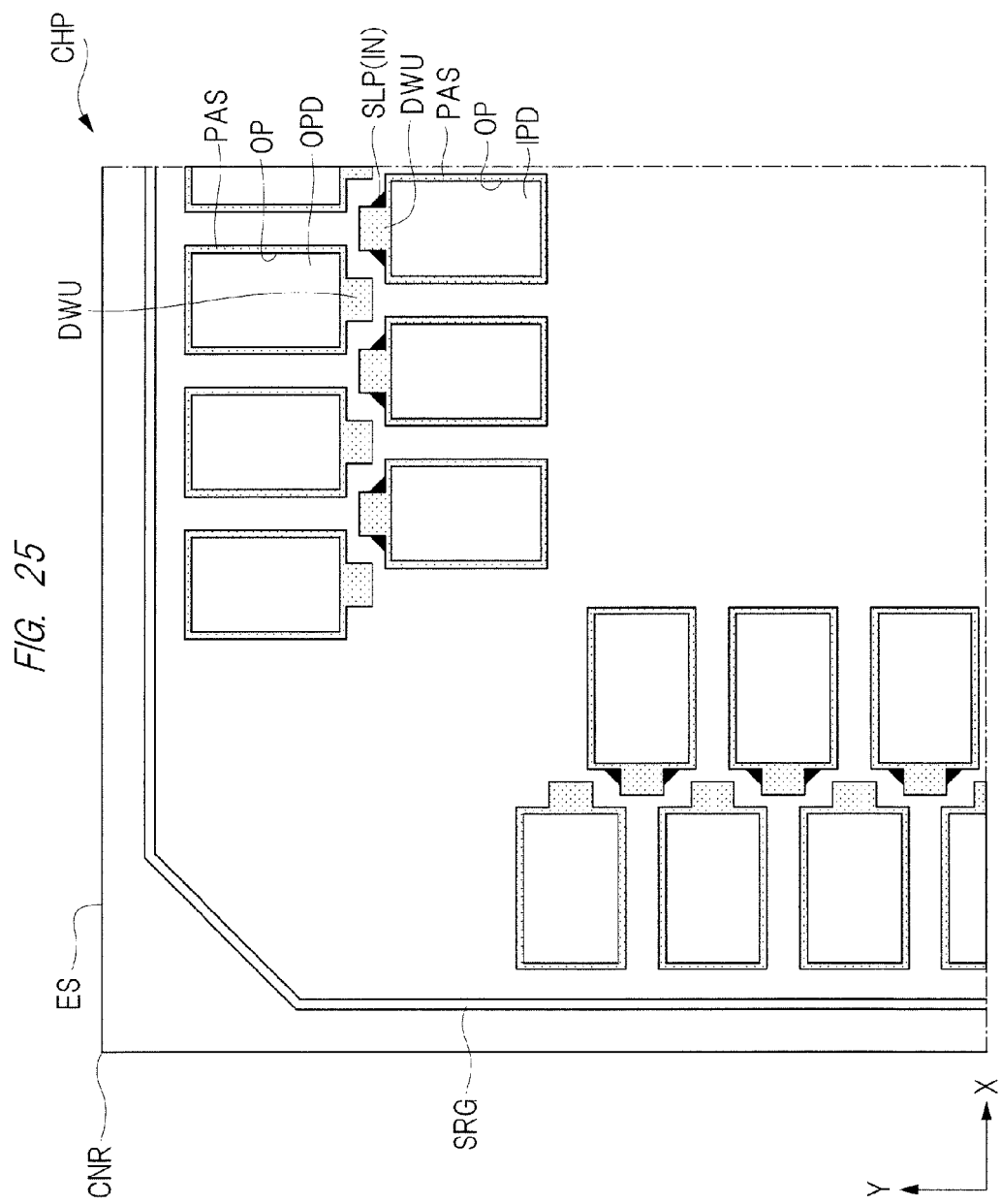
Figure 26:
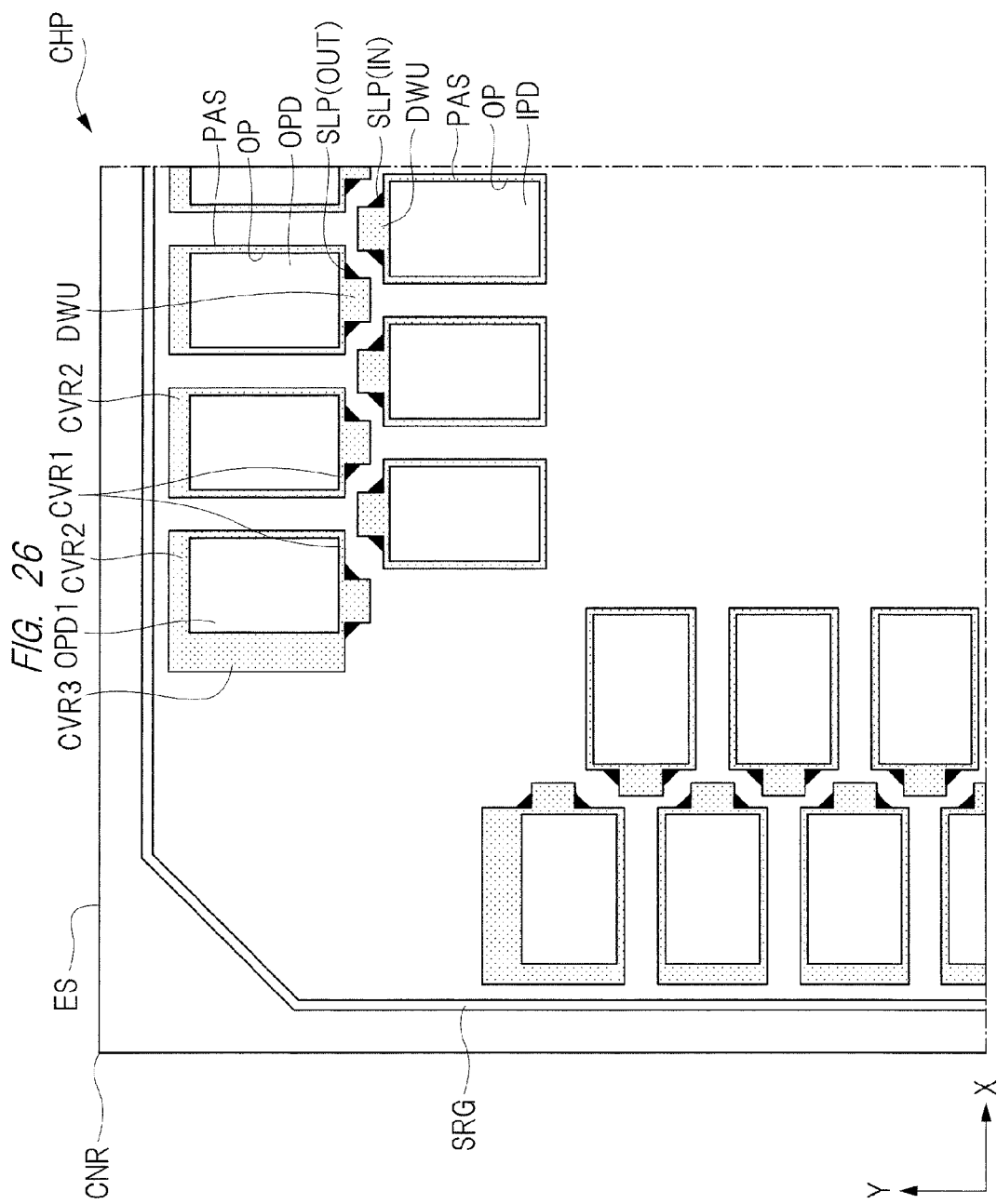
Figure 27:
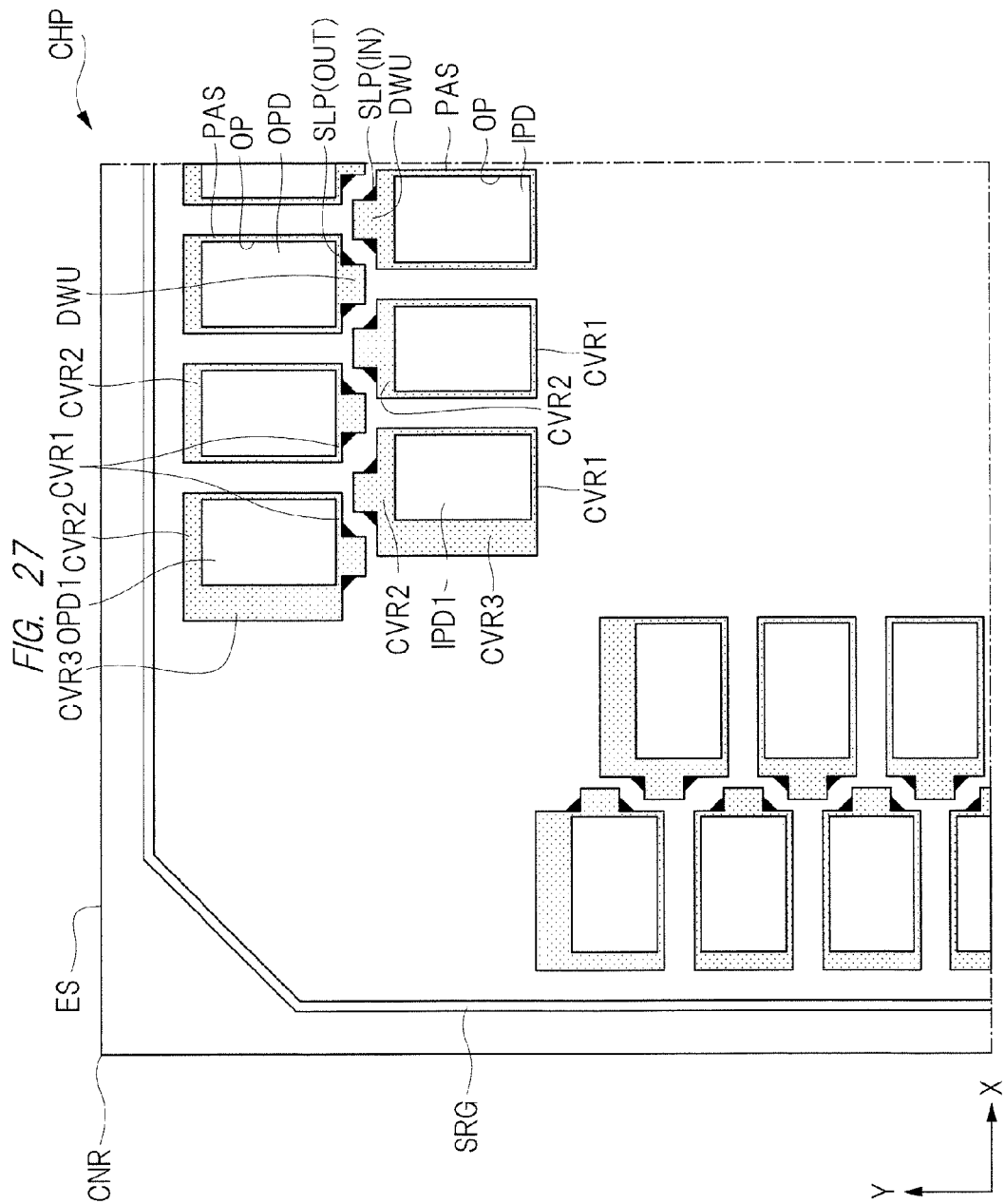
Figure 28:
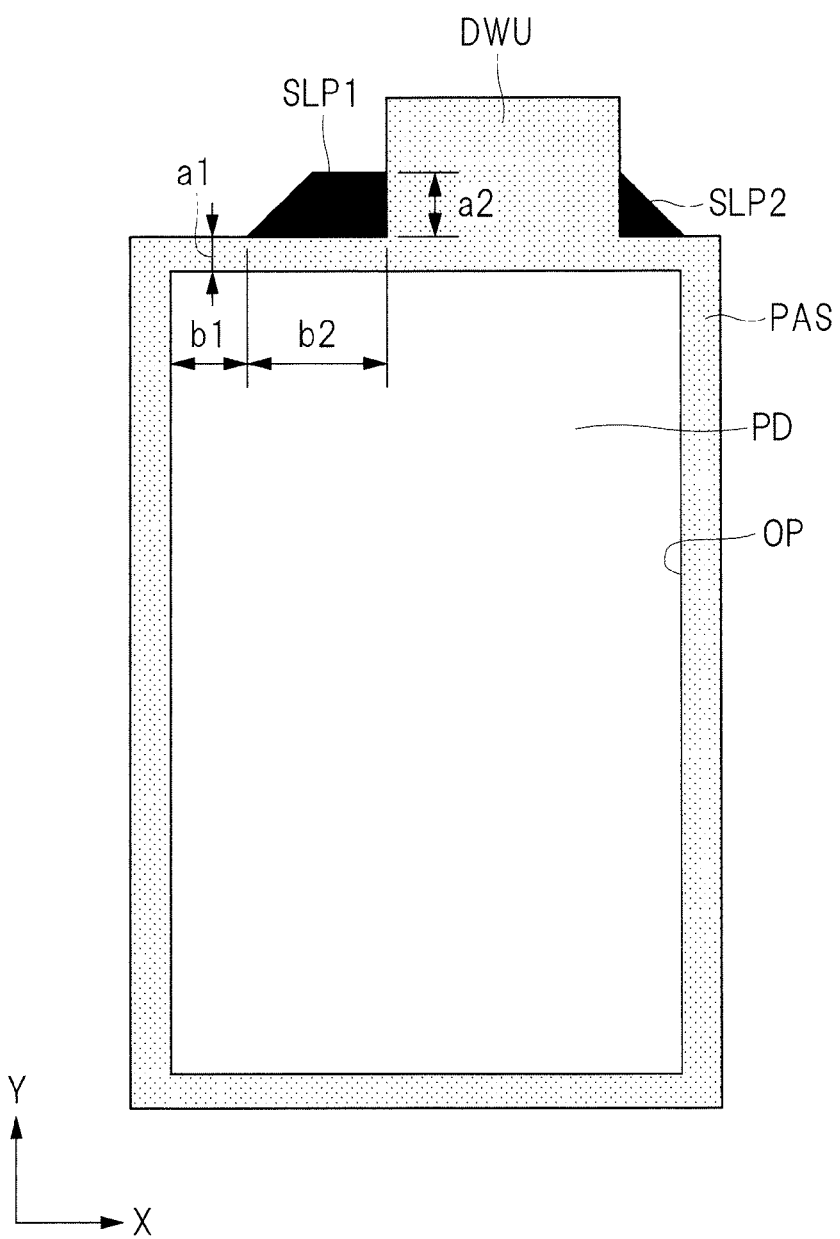
Figure 29:
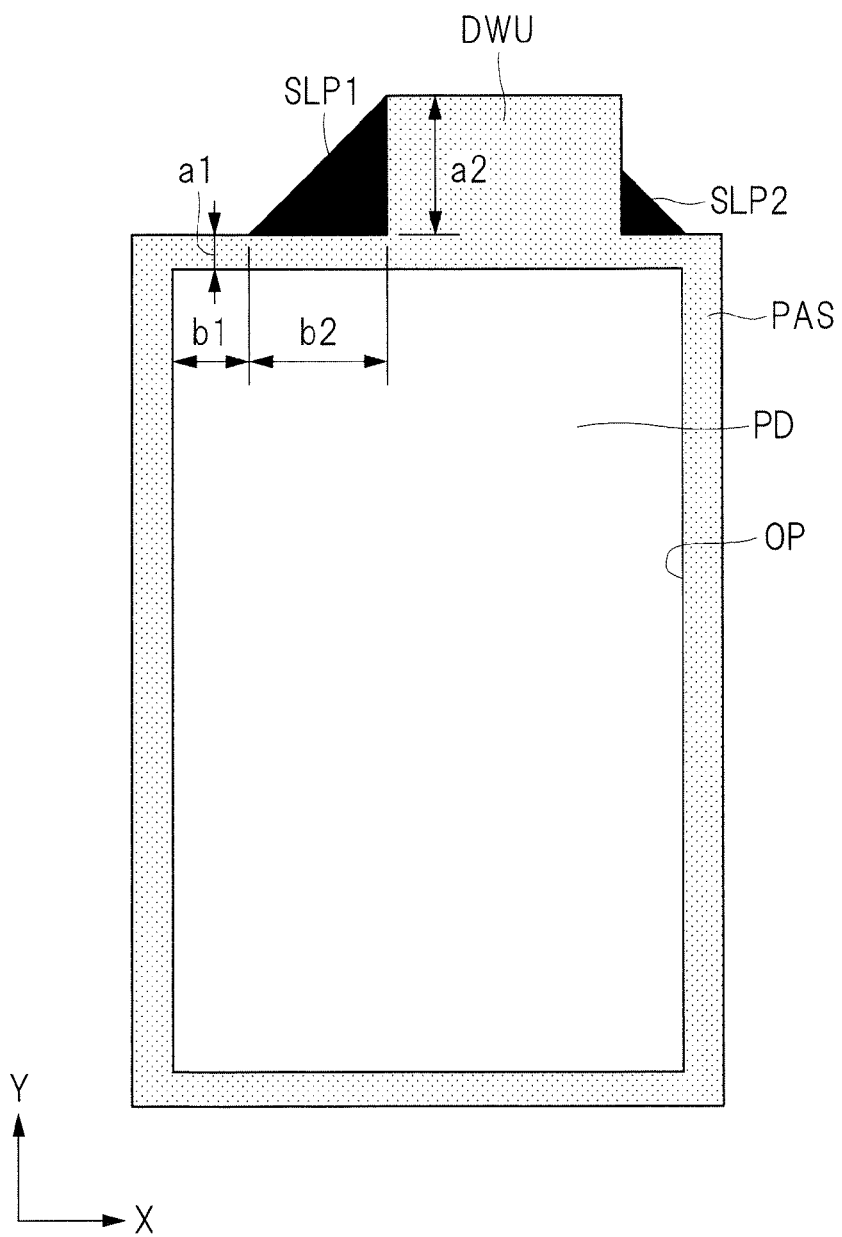
Figure 30:
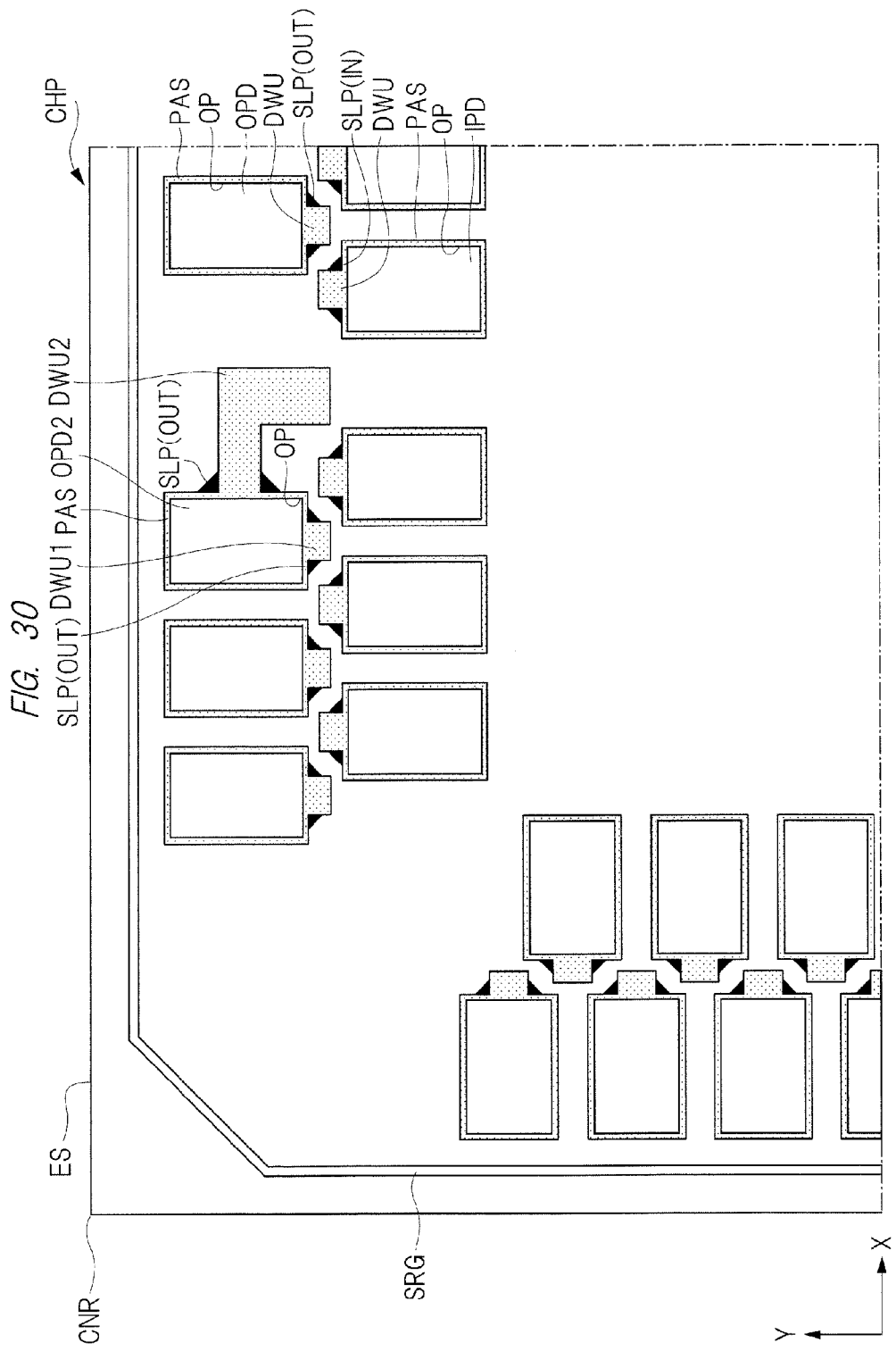
Figure 31:
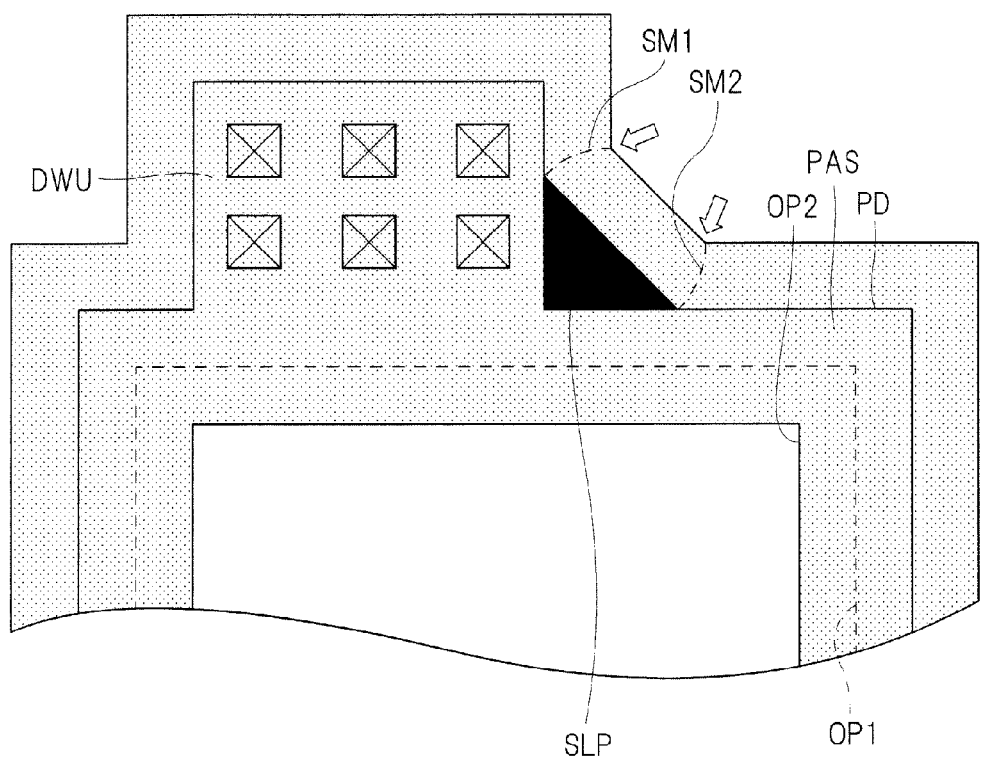

FIG. 1 is a top plan view of a semiconductor device of a QFP package structure;
FIG. 2 is a sectional view along an A-A line of FIG. 1;
FIG. 3 illustrates a layout of a semiconductor chip;
FIG. 4 is an enlarged view of a nearby area of a pad formed on the semiconductor chip;
FIG. 5 is a schematic view of the deformation of the pad;
FIG. 6 is an enlarged plan view of a part of a semiconductor chip according to a first embodiment;
FIG. 7 is an enlarged view of a part of a pad not having a sloped portion that is a feature of the first embodiment;
FIG. 8 is an enlarged view of apart of a pad having the sloped portion that is a feature of the first embodiment;
FIG. 9 is a sectional view along an A-A line of FIG. 6;
FIG. 10 is a schematic view of a configuration of a plurality of pads including a gap therebetween according to the related art;
FIG. 11 is a schematic view of a configuration of a plurality of pads including a gap therebetween according to the first embodiment;
FIG. 12 is a schematic sectional view along a B-B line of FIG. 6;
FIG. 13 is an enlarged plan view of a part of a semiconductor chip according to a modification of the first embodiment;
FIG. 14 is a plan view showing a layout of a semiconductor wafer;
FIG. 15 is a sectional view showing a process of manufacturing a semiconductor device according to the first embodiment;
FIGS. 16A and 16B illustrate a process of manufacturing the semiconductor device that follows the process of FIG. 15, FIG. 16A being a plan view of a pad, and FIG. 16B being a sectional view along an A-A line of FIG. 16A;
FIGS. 17A and 17B illustrate a process of manufacturing the semiconductor device that follows the process of FIGS. 16A and 16B, FIG. 17A being a plan view of a pad, and FIG. 17B being a sectional view along an A-A line of FIG. 17A;
FIGS. 18A and 18B illustrate a process of manufacturing the semiconductor device that follows the process of FIGS. 17A and 17B, FIG. 18A being a plan view of a pad, and FIG. 18B being a sectional view along an A-A line of FIG. 18A;
FIGS. 19A and 19B illustrate a process of manufacturing the semiconductor device that follows the process of FIGS. 18A and 18B, FIG. 19A being a plan view of a pad, and FIG. 19B being a sectional view along an A-A line of FIG. 19A;
FIG. 20 is a diagram of the semiconductor chip after formation of pads thereon, showing a schematic sectional view of the vicinity of a boundary area of an edge side (serving as a boundary in this stage);
FIG. 21 is a flowchart showing a flow of steps of, for example, manufacturing a semiconductor device of a QFP package structure after the formation of integrated circuits on a semiconductor wafer;
FIG. 22 is an enlarged view of a part of a semiconductor chip according to a second embodiment;
FIG. 23 is an enlarged view of a part of a semiconductor chip according to a third embodiment;
FIG. 24 is an enlarged view of a part of a semiconductor chip in a first modification according to the third embodiment;
FIG. 25 is an enlarged view of a part of a semiconductor chip in a second modification according to the third embodiment;
FIG. 26 is an enlarged view of a part of a semiconductor chip according to a fourth embodiment;
FIG. 27 is an enlarged view of a part of a semiconductor chip according to a modification of the fourth embodiment;
FIG. 28 is a plan view schematically showing a configuration of a pad according to a fifth embodiment;
FIG. 29 is a plan view schematically showing a configuration of a pad according to a modification of the fifth embodiment;
FIG. 30 is an enlarged view of a part of a semiconductor chip according to a sixth embodiment;
FIG. 31 is an enlarged view of a part of a semiconductor chip according to a seventh embodiment; and FIG. 32 a sectional view showing a gap between the pads according to the seventh embodiment.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Moreover, in some drawings for describing in the embodiments, hatching is used even in a plan view so as to make the drawings easy to see.

First Embodiment

Example of Configuration of Semiconductor Device (QFP Package)

A semiconductor device includes various package structures, such as BGA (Ball Grid Array) and QFP (Quad Flat Package). A technical concept according to a first embodiment can be applied to these package structures. Hereinafter, a configuration of a semiconductor device of a QFP package structure will be described as one example.

FIG. 1 is a top plan view of a semiconductor device SA1 of a QFP package structure. As shown in FIG. 1, the semiconductor device SA1 is a rectangular shape with its upper surface covered with a resin (sealing body) MR. From four sides defining the outline of the resin MR, outer leads OL project outward.

The internal structure of the semiconductor device SA1 will then be described. FIG. 2 is a sectional view along an A-A line of FIG. 1. As shown in FIG. 2, the back surface of a chip mounting portion TAB is covered with the resin MR. A semiconductor chip CHP is mounted on the upper surface of the chip mounting portion TAB, which is separated from inner leads IL1 (lead terminals). Pads PD are formed on the main surface of the semiconductor chip CHP. The pads PD formed on the semiconductor chip CHP are connected electrically to the inner leads IL1 via wires W. The semiconductor chip CHP, wires W, and inner leads IL1 are covered with the resin MR, and the outer leads OL (lead terminals) integrated with the inner leads IL1 project out of the resin MR. The outer leads OL projecting out of the resin MR are molded into a gull-wing shape and have their surfaces covered with a plating film PF.

The chip mounting portion TAB, inner leads IL1, and outer leads OL are made of, for example, a 42 alloy that is an alloy of copper, iron, and nickel. The wires W are made of, for example, gold. The semiconductor chip CHP is made of, for example, silicon and compound semiconductor (GaAs, etc.), and has a plurality of semiconductor elements, such as MOS-FETs, formed thereon. Above the semiconductor elements, multi-layered wirings are formed via inter-layer insulating films, and on the uppermost layer of the multi-layered wirings, the pads PD are formed to be connected to the multi-layered wirings. Therefore, the semiconductor elements formed on the semiconductor chip CHP are connected electrically to the pads PD via the multi-layered wirings. In other words, the semiconductor elements formed on the semiconductor chip CHP and the multi-layered wirings jointly form an integrated circuit, and the pads PD function as terminals that connect the integrated circuit to a device outside the semiconductor chip CHP. The pads PD are connected to the inner leads IL1 via the wires W and are therefore connected to the outer leads OL formed integrally with the inner leads IL1. Thus, the integrated circuit formed on the semiconductor chip CHP is connected electrically to a device outside the semiconductor device SA1 via a path: pads PD→wires W→inner leads IL1→outer leads OL→external connection device. It is therefore understood that by inputting electric signals to the semiconductor chip CHP through the outer leads OL formed on the semiconductor device SA1, the integrated circuit formed on the semiconductor chip CHP can be controlled, and that output signals from the integrated circuit can be transferred outside through the outer leads OL.

FIG. 3 illustrates a layout of the semiconductor chip CHP. In FIG. 3, the semiconductor chip CHP is, for example, rectangular, and a plurality of pads PD are arranged along the edge sides ES of the semiconductor chip CHP. Specifically, as shown in FIG. 3, a seal ring SRG is formed inside and along the edge sides ES of the rectangular semiconductor chip CHP. Inside the seal ring SRG, the plurality of pads PD are arranged along the edge sides ES of the rectangular semiconductor chip CHP. At each of the pads PD, the most part of surface of the pad PD is exposed through an opening provided on a surface protective film while the edge of the pad PD is covered with the surface protective film. This is not shown in FIG. 3.

For example, a crack may be formed on the surface protective film covering the edge of the pad due to a stress applied upon dicing the semiconductor chip CHP into pieces and a stress applied by the resin (sealing body) sealing the semiconductor chip CHP. The conventional resin-sealed semiconductor device, therefore, should be further improved in view of the necessity of preventing the formation of a crack on the surface protective film covering a step formed on the edge of the pad to improve the reliability of the semiconductor device.

<Semiconductor Device that should be Further Improved>

FIG. 4 is an enlarged view of a nearby area of the pad PD formed on the semiconductor chip. As shown in FIG. 4, the seal ring SRG is formed inside the edge side ES of the semiconductor chip and the pad PD is formed inside the seal ring SRG. The pad PD is rectangular and has a lead-out wiring portion DWU formed integrally with the pad PD. The lead-out wiring portion DWU has a function of connecting the pad PD to wiring (not illustrated) formed under the pad PD. The pad PD is covered with a surface protective film PAS, on which an opening OP is formed to expose part of the surface area of the pad PD. In other words, the most part of surface area of the pad PD is exposed through the opening OP provided on the surface protective film PAS while the edge area including the edge of the pad PD is covered with the surface protective film PAS.

In this specification, the edge area of the pad PD covered with the surface protective film PAS is defined as coating area. In FIG. 4, for example, the coating area is dotted, and the part of surface protective film PAS that covers the outer part of the step formed on the edge of the pad PD is also dotted. The surface protective film PAS is so formed as to cover the entire substrate on which the pad PD is formed. In FIG. 4, for example, out of the surface protective film PAS, the coating area covering the edge of the pad PD and the part of surface protective film PAS that is formed on the outer part of the step formed on the edge of the pad PD are indicated as dotted areas.

A case is assumed where, for example, the resin sealing the semiconductor chip swells or shrinks during a temperature cycle test, etc., and, for example, a stress caused by the swell or shrinkage of the resin is applied to the pad PD, as shown in FIG. 5. It is assumed in this case, as indicated by arrows of FIG. 5, that the stress generated in the resin sealing the semiconductor chip is applied from the edge side ES of the semiconductor chip to the pad PD. In this case, the stress generated in the resin sealing the semiconductor chip deforms the coating area of the pad PD covered with the surface protective film PAS. This raises a possibility of formation of "aluminum slide", which refers to a slide of a part of the pad PD, and formation of a crack CLK on part of the coating area of the pad PD covered with the surface protective film PAS.

The inventor has examined this problem and found the following three factors to be the causes of "aluminum slide" and crack CLK. A first factor is that, as shown in FIG. 5, because a connecting part between the pad PD and the lead-out wiring portion DWU is a right angle part, the crack CLK is formed easily on the surface protective film PAS on the connecting part. This first factor is explained as below. For example, when the connecting part between the pad PD and the lead-out wiring portion DWU is the right angle part, a discontinuous area (seam area) of the surface protective film PAS covering the connecting part concentrates on one spot. This results in concentration of a stress on the discontinuous area with low stress resistance, which leads to formation of the crack CLK on the surface protective film PAS on the connecting part.

The second factor is that the crack CLK is formed easily on the surface protective film PAS due to the small width of the coating area of the pad PD covered with the surface protective film PAS. This second factor is assumed based on the fact that the stress resistance of the surface protective film PAS is smaller in a case where the width of the coating area of the pad PD covered with the surface protective film PAS is smaller than a case where the width of the coating area of the pad PD covered with the surface protective film PAS is larger.

The third factor is that "aluminum slide", i.e., a shift of a part of the pad PD, and formation of the crack CLK on the surface protective film PAS occur easily because the length of a line segment (part of one side of the pad PD) perpendicular to the width of the coating area is longer than the width of the coating area of the pad PD that is covered with the surface protective film PAS. This third factor can be understood from the fact that as the length of the line segment perpendicular to the width of the coating area becomes larger, the line segment becomes easier to deflect due to a stress applied in the direction perpendicular to the line segment, and warp in a greater extent.

This specification pays attention to the above first to third factors and describes technical concepts for suppressing the formation of the "aluminum slide" and crack CLK. A first embodiment will be described as a technical concept of providing an idea for dealing with the first factor that because the connecting part between the pad PD and the lead-out wiring portion DWU is the right angle part, the crack CLK is formed easily on the surface protective film PAS on the connecting part.

<Configuration of Semiconductor Chip>

FIG. 6 is an enlarged plan view of a part of the semiconductor chip CHP according to the first embodiment. In FIG. 6, the semiconductor chip CHP is of a rectangular having a plurality of edge sides ES that intersect each other to form corners CNR. Inside the edge sides of the semiconductor chip CHP, the seal ring SRG that suppresses entry of a foreign object into the semiconductor chip CHP is formed. Inside the seal ring SRG, a plurality of pads PD made mainly of aluminum (main component) are arranged along the edge sides ES of the semiconductor chip CHP. Each of the plurality of pads PD is of, for example, a rectangular, such as oblong. At each of the pads PD, the most part of surface of the pad PD is exposed through the opening OP provided on the surface protective film PAS while the edge of the pad PD is covered with the surface protective film PAS. The lead-out wiring portion DWU is provided integrally with each of the pads PD, and is covered with the surface protective film PAS. In FIG. 6, the seal ring SRG is formed inside the edge sides ES of the semiconductor chip CHP. However, a dummy pattern may be provided between the edge sides ES of the semiconductor chip CHP and the seal ring SRG, where the dummy pattern suppresses the progress of a crack, which may be formed during the dicing process, to the interior of the semiconductor chip CHP (inside tip region). The dummy pattern is not always necessary. Providing the dummy pattern is nevertheless preferable in order to prevent crack formation during the dicing process and improve the flattening performance of a CMP process that is carried out upon formation of each wiring layer.

In this specification, "main component" refers to a material component whose content is the largest among the contents of material components making up a member (layer, film, etc.). For example, "pad PD made mainly of aluminum (main component)" means that the pad PD contains aluminum (Al) as its material with the largest content. The term "main component" is used in this specification with the intension of, for example, expressing the fact that the pad PD is basically made of aluminum but that does not exclude a possibility that other impurities are also included in the pad PD.

For example, the ordinary pad PD used in the semiconductor device is usually configured such that an aluminum film is held between barrier conductive films made of titanium/titanium nitrogen. In other words, the pad PD is composed of a first burrier conductive film, an aluminum film formed on the first burrier conductive film, and a second burrier conductive film formed on the aluminum film. In this case, the pad PD is composed of a stacked film made up of the first burrier conductive film, the aluminum film, and the second burrier conductive film. Such a pad PD whose major part is occupied with the aluminum film is thus referred to as "pad PD made mainly of aluminum (main component)".

The term "aluminum film" is used in this specification as a term with a broader definition that represents not only the pure aluminum film but also an aluminum alloy film (AlSi film) made by adding silicon to aluminum, and an aluminum alloy film (AlSiCu film) made by adding silicon and copper to aluminum. The pad PD containing these aluminum alloy films is therefore also regarded as "pad PD made mainly of aluminum (main component)". Hence the phrase "pad PD made mainly of aluminum (main component)" is used in this specification to refer to the pad PD containing the aluminum film and barrier conductive films, and also to the pad PD whose aluminum film is an aluminum alloy film.

Features of Embodiment

The features of the first embodiment will then be described. FIG. 6 illustrates a feature of the first embodiment that sloped portions SLP serving as reinforcing patterns are provided on the connecting portions between the pad PD and the lead-out wiring portion DWU, respectively. According to the first embodiment, the sloped portions suppress formation of the crack CLK on the coating area where the part of pad PD that is covered with the surface protective film PAS. The reasons for this conclusion will be described, referring to drawings.

FIG. 7 is an enlarged view of a part of a pad PD not having the sloped portion SLP that is the feature of the first embodiment. In FIG. 7, the pad PD and the lead-out wiring portion DWU are connected integrally to each other, and no sloped portion SLP is formed on the connecting part between the pad PD and the lead-out wiring portion DWU. In FIG. 7, the pad PD and the lead-out wiring portion DWU are connected perpendicularly to each other (make a right angle) on the connecting part. For this reason, as shown in FIG. 7, a discontinuous area SM (seam area) resulting from the deposition process, which is indicated by a dotted line, is formed concentratively at one spot on the surface protective film PAS covering the connecting part between the pad PD and the lead-out wiring portion DWU. As a result, on the pad PD of FIG. 7, a stress is concentrated on the discontinuous area SM with low stress resistance, which creates a condition where a crack is formed easily on the surface protective film PAS on the connecting part between pad PD and the lead-out wiring portion DWU.

FIG. 8 is an enlarged view of a part of a pad PD having the sloped portion SLP serving as the reinforcing pattern that is the feature of the first embodiment. In FIG. 8, the pad PD and the lead-out wiring portion DWU are connected integrally to each other, and the sloped portion SLP is formed on the connecting part between the pad PD and the lead-out wiring portion DWU. The sloped portion SLP is formed as, for example, a right triangle. As a result, in FIG. 8, the connection angle of the connecting part between the pad PD and the lead-out wiring portion DWU turns out to be obtuse angles each larger than a right angle.

In this case, at the pad PD of FIG. 7, because of the absence of the sloped portion SLP, the connection angle of the connecting part between the pad PD and the lead-out wiring portion DWU is a right angle formed at one spot. At the pad PD of FIG. 8, on the other hand, because of the presence of the sloped portion SLP, the connection angle of the connecting part between the pad PD and the lead-out wiring portion DWU is made up of obtuse angles formed at two spots. This means that at the pad PD of FIG. 7, the discontinuous area SM is formed at one spot corresponding to the right angle at one spot, while at the pad PD of FIG. 8, two discontinuous areas SM1 and SM2 are formed respectively at two spots corresponding to two obtuse angles at two spots. In other words, at the pad PD of FIG. 7, the discontinuous area SM (seam area) resulting from the deposition process, which is indicated by the dotted line, is formed concentratively at one spot on the surface protective film PAS covering the connecting part between the pad PD and the lead-out wiring portion DWU. At the pad PD of FIG. 8, on the other hand, the discontinuous areas SM1 and SM2 resulting from the deposition process, which are indicated by dotted lines, are formed in separation from each other at two spots on the surface protective film PAS covering the connecting part between the pad PD and the lead-out wiring portion DWU. As a result, at the pad PD having the sloped portion SLP according to the first embodiment, the discontinuous areas SM1 and SM2 with low stress resistance present at two spots suppresses concentration of a stress on the discontinuous area with low stress resistance present at one spot. In other words, at the pad PD having the sloped portion SLP according to the first embodiment, because the discontinuous areas SM1 and SM2 with low stress resistance are present at two spots, the stress is distributed between the two discontinuous areas SM1 and SM2. According to the first embodiment, therefore, as a result of distribution of the stress between the two discontinuous areas SM1 and SM2, a stress applied to each of the discontinuous areas SM1 and SM2 turned out to be smaller. Hence, according to the first embodiment, by forming the sloped portion SLP on the connecting part between the pad PD and the lead-out wiring portion DWU, formation of a crack on the surface protective film PAS covering the connecting part between the pad PD and the lead-out wiring portion DWU can be suppressed effectively. The semiconductor device of the first embodiment thus prevents a decline in its reliability caused by crack formation on the surface protective film PAS. In other words, the first embodiment improves the reliability of the semiconductor device.

According to the first embodiment, the width (in the X direction) of the lead-out wiring portion DWU is shorter than the length of a side to which the lead-out wiring portion DWU is connected among a plurality of sides making up each of the plurality of pads PD, and the sloped portions SLP are provided respectively on both sides of the lead-out wiring portion DWU. According to this embodiment, therefore, by forming the sloped portions SLP respectively on both sides of the connection part between the pad PD and the lead-out wiring portion DWU, crack formation on the surface protective film PAS can be suppressed effectively on both sides of the connection part between the pad PD and the lead-out wiring portion DWU.

For example, the pad PD, lead-out wiring portion DWU, and sloped portions SLP are formed integrally out of a film made mainly of aluminum. As shown in FIG. 6, the lead-out wiring portion DWU is connected to the side farthest to the edge side ES of the semiconductor chip CHP among the plurality of sides making up each of the plurality of pads PD.

This configuration is adopted by taking into consideration the fact that the side farthest to the edge side ES of the semiconductor chip CHP among the plurality of sides making up each of the plurality of pads PD is the closest to an integrated circuit region formed inside the semiconductor chip CHP and that forming the lead-out wiring portion DWU on the side farthest to the edge side ES of the semiconductor chip CHP reduces the distance between the integrated circuit formed in the integrated circuit region and the lead-out wiring portion DWU. Specifically, forming the lead-out wiring portion DWU on the side farthest to the edge side ES of the semiconductor chip CHP reduces the parasitic resistance of a wiring which connects the integrated circuit to the lead-out wiring portion DWU, thereby improves the performance of the semiconductor device.

The configuration of FIG. 6 in which the lead-out wiring portion DWU is provided on the side farthest to the edge side ES of the semiconductor chip CHP is preferable in view of suppression of crack formation on the surface protective film PAS on the connecting part between the pad PD and the lead-out wiring portion DWU. This is because that according to an examination by the inventor, in FIG. 6, for example, a stress applied to the coating area of the side closest to the edge side ES of the semiconductor chip CHP among the plurality of sides making up each of the plurality of pads PD tends to become relatively large. In FIG. 6, when the lead-out wiring portion DWU is provided on the side closest to the edge side ES of the semiconductor chip CHP among the plurality of sides making up each of the plurality of pads PD, the connecting part between the pad PD and the lead-out wiring portion DWU, on which connecting part a crack is formed easily, is provided on the side closest to the edge side ES of the semiconductor chip CHP. It is presumed in such a case that a crack is formed easily on the surface protective film PAS on the connecting part between the pad PD and the lead-out wiring portion DWU.

According to the semiconductor device of the first embodiment, in the case of forming the lead-out wiring portion DWU on the side farthest to the edge side ES, means for reducing a possibility of crack formation to the minimum is also provided. Specifically, by forming the sloped portion SLP on the connecting part between the pad PD and the lead-out wiring portion DWU (first configuration), a stress is distributed between the two discontinuous areas SM1 and SM2 of FIG. 8. As a result, a stress applied to each of the discontinuous areas SM1 and SM2 turns out to be smaller (stress reduction effect in the first configuration). In addition, according to the semiconductor device of the first embodiment, by forming the lead-out wiring portion DWU on the side farthest to the edge side ES of the semiconductor chip CHP (second configuration), a stress applied to the connecting part between the pad PD and the lead-out wiring portion DWU is reduced (stress reduction effect in the second configuration).

In this manner, according to the semiconductor device of the first embodiment, a synergic effect created by the first and second configurations effectively suppresses crack formation on the surface protective film PAS on the connection part between the pad PD and the lead-out wiring portion DWU.

According to the first embodiment, the second configuration reduces the connection distance between the integrated circuit formed in the inside region of the semiconductor chip CHP and the lead-out wiring portion DWU, thereby offers an advantage of reducing the parasitic resistance of the wiring, which connects the integrated circuit to the lead-out wiring portion DWU.

The first embodiment thus offers a significant effect of improving the reliability of the semiconductor device while improving its performance.

FIG. 9 is a sectional view along an A-A line of FIG. 6. As shown in FIG. 9, for example, field-effect transistors Q, which are an example of semiconductor elements, are formed on a semiconductor substrate 1S made of silicon. Above the field-effect transistors Q, a fine layer FL is formed, which is composed of, for example, fine copper wiring. On the fine layer FL, a global layer GL is formed, which is composed of copper wiring wider than the copper wiring making up the fine layer FL. On the global layer GL, a plurality of pads PD are formed. The pads PD and the global layer GL are connected via the lead-out wiring portions DWU shown in FIG. 7, etc., and contact holes. As shown in FIG. 9, the pads PD are connected electrically to the field-effect transistors Q formed on the semiconductor substrate 1S via the global layer GL and fine layer FL.

The surface protective film PAS is so formed as to cover a plurality of pads PD and fill a gap between the pads. The openings OP are formed on the surface protective film PAS, and a part of the surface of each pad PD is exposed from the bottom of each opening OP. The wire W made of, for example, gold wiring is connected to the surface of the pad PD exposed through the opening OP. The surface protective film PAS including the surface of the pad PD to which the wire W is connected is covered with, for example, the resin MR.

One of the features of the first embodiment will be described, referring to FIGS. 10 and 11. FIG. 10 is a schematic view of a configuration of a plurality of pads PD including a gap therebetween according to the related art, and FIG. 11 is a schematic view of a configuration of a plurality of pads PD including a gap therebetween according to the first embodiment. As shown in FIG. 10, the gap between the pads PD is filled with the surface protective film PAS, which is composed of, for example, a silicon oxide film OXF1 formed by plasma CVD and a silicon nitride film SNF formed by CVD. Each pad PD is so formed as to have a thickness ranging from 1000 nm to 2000 nm, for example, a thickness of about 1600 nm. The oxide silicon film OXF1 is about 200 nm in thickness, and the silicon nitride film SNF is about 600 nm in thickness. The thickness of the pad PD is, therefore, larger than the sum of the thicknesses of the oxide silicon film OXF1 and the silicon nitride film SNF (1600 nm>200 nm+600 nm=800 nm). As shown in FIG. 10, therefore, the gap between the pads PD is not filled completely with the surface protective film PAS composed of the silicon oxide film OXF1 and the silicon nitride film SNF. As a result, for example, when the resin (not illustrated) covering the pads PD swells and shrinks due to a temperature change during a temperature cycle test, the pads PD easily moves laterally (horizontally). This means that at the pads PD according to the related art of FIG. 10, a crack is formed easily on the surface protective film PAS because of synergic factors consisting of a factor that "aluminum slide" due to a temperature change is apt to occur and tends to cause application of a large stress to the surface protective film PAS covering the edges of the pads PD and a factor that the surface protective film PAS is thin. In other words, the configuration of the pads PD and surface protective film PAS of FIG. 10 should be improved further in view of the necessity of suppressing the formation of "aluminum slide" and cracking.

According to the first embodiment, as described above, the pad PD is formed to be considerably thick. The pad PD is made thicker than conventional pads for the main reasons that low resistance should be achieved in routing of a wiring disposed in the same layer where the pad PD is disposed and that a stress created upon bringing a probe into contact with the lower part of the pad PD by a probing inspection should be eased. However, because an increase in the volume of aluminum content creates a situation where the above "aluminum slide" occurs easily, the measures of the first embodiment are required.

According to the first embodiment, as shown in FIG. 11, the surface protective film PAS is so formed as to completely fill the gap between the pads PD. Specifically, the surface protective film PAS is composed of the silicon oxide film OXF1 formed by plasma CVD, a silicon oxide film OXF2 formed by high-density plasma (HDP) CVD, a silicon oxide film OXF3 formed by plasma CVD using TEOS as a raw material, and the silicon nitride film SNF formed by CVD.

In FIG. 11, each pad PD is so formed as to have a thickness ranging from 1000 nm to 2000 nm, for example, a thickness of about 1700 nm. The oxide silicon film OXF1 is about 200 nm in thickness, the oxide silicon film OXF2 is about 900 nm in thickness, the oxide silicon film OXF3 is about 800 nm in thickness, and the silicon nitride film SNF is, for example, about 600 nm in thickness. The thickness of the pad PD is, therefore, smaller than the sum of the thicknesses of the oxide silicon films OXF1, OXF2, and OXF3 and the silicon nitride film SNF (1700 nm<200 nm+900 nm+800 nm+600 nm=2500 nm). As shown in FIG. 11, therefore, the gap between the pads PD is filled completely with the surface protective film PAS composed of the silicon oxide films OXF1, OXF2, and OXF3 and the silicon nitride film SNF. As a result, for example, even if the resin (not illustrated) covering the pads PD swells and shrinks due to a temperature change during the temperature cycle test, the pads PD fixed firmly by the surface protective film PAS filling the gap hardly moves laterally (horizontally). This means that at the pad PD according to the first embodiment of FIG. 11, "aluminum slide" due to a temperature change hardly occurs and therefore a stress caused by "aluminum slide" and acting on the surface protective film PAS is eased. According to the first embodiment, therefore, because of the feature that the surface protective film PAS is thick enough to completely fill the gap between the pads PD, "aluminum slide" of the pad PD hardly occurs and a crack is hardly formed on the surface protective film PAS. In other words, the configuration of the pads PD and surface protective film PAS according to the first embodiment of FIG. 11 is superior in suppressing the formation of "aluminum slide" and cracking.

As described above, one of the features of the first embodiment is that the surface protective film PAS is so formed as to completely fill a gap between pads PD. Because of this feature, according to the first embodiment, the formation of "aluminum slide" and cracking is suppressed effectively, which improves the reliability of the semiconductor device.

FIG. 12 is a schematic sectional view along a B-B line of FIG. 6. As shown in FIG. 12, a seal ring region SRR is formed inside the edge side ES of the semiconductor chip CHP, and the seal ring SRG is formed in the seal ring region SRR. A region inside the seal ring region SRR is an integrated circuit region ICR, in which the pad PD and the lead-out wiring portion DWU formed integrally with the pad PD are formed. In the first embodiment, a dummy region is not formed outside the seal ring SRG. However, a dummy pattern may be formed in a location outside the seal ring SRG and closer to the edge side ES of the semiconductor chip CHP.

The seal ring SRG disclosed in this embodiment is formed by connecting multiple wiring layers, and is connected to the semiconductor substrate 1S. The seal ring SRG is connected to wells formed on the semiconductor substrate 1S (which connection is not illustrated) and is given a fixed potential, such as ground potential. The dummy pattern can be formed of the multiple wiring layers as the seal ring SRG is. Each of the wiring layers may be connected to or separated from each other. Different from the seal ring SRG, the dummy pattern is not connected to a fixed potential node and, in many cases, is kept in a floating state.

As shown in FIG. 12, the surface protective film PAS is so formed as to cover the pad PD and lead-out wiring portion DWU formed integrally together. The opening OP is formed on the surface protective film PAS, and a part of the surface of the pad PD is exposed from the bottom of the opening OP as the lead-out wiring portion DWU is covered entirely with the surface protective film PAS. The surface protective film PAS covers the seal ring region SRR formed outside the integrated circuit region ICR and extends to the edge side ES of the semiconductor chip CHP.

In FIG. 12, a wiring structure and a device structure formed under the pad PD and lead-out wiring portion DWU formed in the integrated circuit region ICR are basically the same as those shown in FIG. 9 and are therefore not illustrated. The wire W connected to the pad PD and the resin covering the surface protective film PAS are also omitted from FIG. 12.

<Modification>

The semiconductor device of the first embodiment is configured in the above manner. A modification of the first embodiment will hereinafter be described.

FIG. 13 is an enlarged plan view of a part of the semiconductor chip CHP of the modification. FIG. 13 shows a feature of the modification such that the lead-out wiring portion DWU is connected to the side closest to the edge side ES of the semiconductor chip CHP among the plurality of sides making up each of the plurality of pads PD and that the sloped portions SLP are provided on the connecting parts between the pad PD and the lead-out wiring portion DWU. According to the modification, in the same manner as in the first embodiment, crack formation on the surface protective film PAS on each connecting part between the pad PD and the lead-out wiring portion DWU can be suppressed effectively.

For example, according to an examination by the inventor, a stress applied to the coating area covering the side closest to the edge side ES of the semiconductor chip CHP among the plurality of sides making up the pad PD tends to become relatively large. As shown in FIG. 13, when the lead-out wiring portion DWU is provided on the side closest to the edge side ES of the semiconductor chip CHP among the plurality of sides making up the pad PD, the connecting part between the pad PD and the lead-out wiring portion DWU, on which connecting part a crack is formed easily, is formed on the side closest to the edge side ES of the semiconductor chip CHP. It is assumed in such a case that a crack is formed easily on the surface protective film PAS on the connecting part between the pad PD and the lead-out wiring portion DWU. Ordinary reasoning thus leads to a conclusion that the configuration in which the lead-out wiring portion DWU is provided on the side closest to the edge side ES of the semiconductor chip CHP among the plurality of sides making up the pad PD is unlikely to be adopted in view of the necessity of suppressing crack formation.

According to the modification, as a result of formation of the sloped portion SLP on the connecting part between the lead-out wiring portion DWU and the pad PD, even if the lead-out wiring portion DWU is provided on the side closest to the edge side ES of the semiconductor chip CHP among the plurality of sides making up the pad PD, formation of a crack, which develops easily on the connecting part between the pad PD and the lead-out wiring portion DWU, can be suppressed. According to the modification, because the configuration in which the sloped portion SLP is formed on the connecting part between the lead-out wiring portion DWU and the pad PD leads to suppression of crack formation on the connecting part between the lead-out wiring portion DWU and the pad PD, the configuration in which the lead-out wiring portion DWU is provided on the side closest to the edge side ES of the semiconductor chip CHP among the plurality of sides making up the pad PD is considered to be acceptable. Generally speaking, according to the modification, arrangement of the lead-out wiring portion DWU that is supposed to be unacceptable in view of crack prevention is rendered acceptable by adopting the technical concept of forming the sloped portion SLP on the connecting part between the lead-out wiring portion DWU and the pad PD.

Hence, according to the modification, a degree of freedom in arranging the lead-out wiring portion DWU can be improved as crack formation on the connecting part between the lead-out wiring portion DWU and the pad PD is suppressed. According to the modification, therefore, an improvement in the degree of freedom in arranging the lead-out wiring portion DWU formed integrally with the pad PD leads to an improvement in a degree of freedom in an overall layout of the semiconductor chip CHP. This means that the modification allows novel layout designing not obstructed by conventional restrictions, thus improving a degree of freedom in designing the semiconductor device.

<Method of Manufacturing Semiconductor Device>

A method of manufacturing the semiconductor device according to the first embodiment will then be described, referring to the drawings. FIG. 14 is a plan view showing a layout of a semiconductor wafer WF. As shown in FIG. 14, the semiconductor wafer WF is of an approximate disc shape, and has a plurality of chip regions CR in its internal area. In each of the plurality of chip regions CR, semiconductor elements, such as field-effect transistors, and the multiple wiring layers are formed, and the plurality of chip regions CR are demarcated by a scribe region SCR. According to the first embodiment, as shown in FIG. 14, the semiconductor wafer (semiconductor substrate) WF having the rectangular chip regions CR and the scribe region SCR demarcating them is prepared. In the stage of preparation of the semiconductor wafer WF, in each of the chip regions CR of the semiconductor wafer WF, the semiconductor elements, such as field-effect transistors, are formed and the multiple wiring layers made of copper wiring are formed above the semiconductor elements by, for example, the damascene method. In the following description, a process of forming pads on the uppermost layer of the multiple wiring layers in each of the chip regions CR will first be described.

As shown in FIG. 15, on an interlayer insulating film IL, a stacked film is formed, which is composed of a barrier conductive film BCF1, an aluminum film AF formed on the barrier conductive film BCF1, and a barrier conductive film BCF2 formed on the aluminum film AF. The barrier conductive film BCF1 is made of, for example, a stack of a titanium film and a titanium nitride film, and is formed by, for example, sputtering. The aluminum film AF is a film made mainly of aluminum, and is formed by, for example, sputtering. The barrier conductive film BCF2 is a film made of, for example, titanium nitride and is formed by, for example, sputtering, and may be made of a stacked film of titanium and titanium nitride. For example, the barrier conductive film BCF1 is about 110 nm in thickness (titanium film of 50 nm+ titanium nitride film of 60 nm), the aluminum film AF is about 1500 nm in thickness, and the barrier conductive film BCF2 (titanium nitride film) is about 75 nm in thickness.

Subsequently, as shown in FIGS. 16A and 16B, the stacked film composed of the barrier conductive film BCF1, the aluminum film AF, and the barrier conductive film BCF2 is patterned by photolithography and etching. By patterning the stacked film, the rectangular pad PD, the lead-out wiring portion DWU provided on the pad PD, and the sloped portions SLP provided on the connecting parts between the pad PD and the lead-out wiring portion DWU are formed integrally in each of the chip regions along the boundaries between the chip regions and the scribe region. At this time, because the pad PD, lead-out wiring portion DWU, and sloped portions SLP are made out of the same stacked film, they are almost equal in height.

Subsequently, as shown in FIGS. 17A and 17B, the silicon oxide film OXF1 is so formed on the interlayer insulating film IL that the silicon oxide film OXF1 covers the pad PD, lead-out wiring portion DWU, and sloped portions SLP. The silicon oxide film OXF1 is formed by, for example, plasma CVD (Chemical Vapor Deposition) and is made into a film of about 200 nm in thickness. The silicon oxide film OXF2 is then formed on the silicon oxide film OXF1. The silicon oxide film OXF2 is formed by, for example, high-density plasma CVD proceeding with film etching and film deposition simultaneously, and is made into a film of about 900 nm in thickness. The silicon oxide film OXF3 is then formed on the silicon oxide film OXF2. The silicon oxide film OXF3 is formed by, for example, plasma CVD using TEOS as a raw material, and is made into a film of about 800 nm in thickness. Finally, the silicon nitride film SNF is formed on the silicon oxide film OXF3. The silicon nitride film SNF is formed by, for example, CVD. In this manner, the surface protective film PAS composed of the silicon oxide films OXF1, OXF2, and OXF3 and the silicon nitride film SNF is so formed as to cover the pad PD, lead-out wiring portion DWU, and sloped portions SLP.

According to the first embodiment, the surface protective film PAS is thicker than the pad PD. A gap between the pads PD is therefore filled completely with the surface protective film PAS composed of the silicon oxide films OXF1, OXF2, and OXF3 and the silicon nitride film SNF.

Subsequently, as shown in FIGS. 18A and 18B, the opening OP that exposes a part of the pad PD is formed on the surface protective film PAS by photolithography and etching. An opening that exposes the lead-out wiring portion DWU and the sloped portions SLP is not formed, so that the surfaces of the lead-out wiring portion DWU and the sloped portions SLP are kept covered with the surface protective film PAS. Subsequently, as shown in FIGS. 19A and 19B, the surface of the pad PD exposed through the opening OP is etched to eliminate the barrier conductive film (titanium nitride film) formed on the surface of the pad PD exposed through the opening OP. As a result, the aluminum film is exposed through the opening OP.

In the above manner, the pads PD are formed on the uppermost layer of the multiple wiring layers. Specifically, FIG. 20 is a diagram of the semiconductor chip after formation of the pads PD thereon, showing a schematic sectional view of the vicinity of the boundary area of the edge side ES (serving as a boundary in this stage). In FIG. 20, the seal ring region SRR and the integrated circuit region ICR are formed inside the scribe region SCR. The seal rings SRG are formed on the seal ring region SRR. This seal ring SRG is formed by the process identical with the process of forming the multi-layered wirings (not illustrated in FIG. 20) in the integrated circuit region ICR, in which the pads PD are formed on the uppermost layer.

A process to follow the above process will then be described, referring to a flowchart. FIG. 21 is a flowchart showing a flow of steps of, for example, manufacturing the semiconductor device of the QFP package structure after the formation of integrated circuits on a semiconductor wafer.

An integrated circuit is formed first in each of the plurality of chip regions of the semiconductor wafer, and then the semiconductor wafer is diced along the scribe region (S101 of FIG. 21). The semiconductor wafer is thus diced into separate pieces of chip regions to acquire semiconductor chips each carrying the integrated circuit. Each semiconductor chip is then mounted on a chip mounting portion formed on a lead frame (S102 of FIG. 21) and then pads and inner leads formed on the semiconductor chip are connected by wires (S103 of FIG. 21). Subsequently, the chip mounting portion, the semiconductor chip, the wires, and the inner leads are sealed with a resin (S104 of FIG. 21). After cutting a dam formed on the lead frame (S105 of FIG. 21), the surface of the outer leads exposed out of the resin is coated with a plating film (S106 of FIG. 21). Subsequently, marks are formed on the surface of the resin (S107 of FIG. 21) and then the outer leads projecting out of the resin are formed (S108 of FIG. 21). After being manufacturing in this manner, the semiconductor device is subjected to an electrical characteristics test (S109 of FIG.

21). The semiconductor device is then subjected to a temperature cycle test (5110 of FIG. 21), after which any semiconductor device evaluated as a non-defective product is shipped out.

Second Embodiment

The first embodiment has been described as the technical concept of providing the idea for dealing with the first factor that because the connecting part between the pad PD and the lead-out wiring portion DWU is a right angle part, the crack CLK is formed on the surface protective film PAS covering the connecting part. A second embodiment offers a technical concept of providing an idea for dealing with the second factor that the crack CLK is formed easily on the surface protective film PAS due to the small width of the coating area of the pad PD that is covered with the surface protective film PAS, in addition to the technical concept described as the first embodiment.

FIG. 22 is an enlarged plan view of a part of the semiconductor chip CHP according to the second embodiment. FIG. 22 shows a feature of the second embodiment that the central position of the opening OP is shifted in an inward direction (central direction) of the semiconductor chip CHP, relative to the central position of each of the plurality of pads PD.

As a result, as shown in FIG. 22, the width of a coating area CRV2 of the surface protective film PAS that covers the side closest to the edge side ES of the semiconductor chip CHP among the plurality of sides making up each of the plurality of pads PD is made larger than the width of a coating area CRV1 of the surface protective film PAS that covers the side farthest to the edge side ES of the semiconductor chip CHP. This means that the width (in the Y direction) of the coating area CRV2 of the side (closest side to the edge side ES of the semiconductor chip CHP), which is most likely to be subjected to a stress caused by the swell and shrinkage of the resin (not illustrated) due to a temperature change among the plurality of sides making up the pad PD, can be increased relatively. Since relatively increasing the width (in the Y direction) of the coating area CRV2 means improving the crack resistance to a stress, according to the semiconductor device of the second embodiment, crack formation on the coating area CRV2 of the surface protective film PAS that covers the side closest to the edge side ES of the semiconductor chip CHP can be suppressed. According to the second embodiment, in addition to suppression of crack formation on the connecting part between the lead-out wiring portion DWU and the pad PD that is achieved by forming the sloped portion SLP on the connecting part, an effect of suppression of crack formation on the coating area CRV2 of the surface protective film PAS that covers the side closest to the edge side ES of the semiconductor chip CHP is also achieved. The technical concept of the second embodiment therefore provides an idea for dealing with the above first and second factors, by which means a synergic factor consisting of the first and second factors can be suppressed effectively. Hence, the highly reliable semiconductor device having superior crack resistance is provided.

As shown in FIG. 22, in the second embodiment, attention is paid to a pad PD1 closest to a corner CNR of the semiconductor chip CHP among the plurality of pads PD. Specifically, as shown in FIG. 22, at the pad PD1 closest to the corner CNR of the semiconductor chip CHP, the width of a coating area CRV3 of the surface protective film PAS that covers the side closest to the corner of the semiconductor chip CHP among the plurality of sides making up the pad PD1 is also made larger than the width of the coating area CRV1 of the surface protective film PAS that covers the side farthest to the edge side ES of the semiconductor chip CHP.

As a result, according to the second embodiment, at the pad PD1 closest to the corner CNR of the semiconductor chip CHP, the width (in the Y direction) of the coating area CRV2 covering the side (side closest to the edge side ES of the semiconductor chip CHP) where a stress caused by the swell and shrinkage of the resin (not illustrated) due to a temperature change tends to become larger can be increased relatively. In addition, according to the second embodiment, the width of the coating area CRV3 covering the side closest to the corner CNR, on the side where a stress tends to become larger, can also be increased relatively. As a result, according to the second embodiment, the crack resistance of the pad PD1 disposed closest to the corner CNR of the semiconductor chip CHP is improved particularly.

Means for realizing the configuration in which the central position of the opening OP is shifted in an inward direction (central direction) of the semiconductor chip CHP relative to the central position of each of the plurality of pads PD include first means by which the size of the opening OP is reduced while the size (area) of the pad PD is maintained, and second means by which the size of the pad PD is increased while the size (area) of the opening OP is maintained. For example, the first means offers an advantage that because the size of the pad PD is maintained, the technical concept of the second embodiment can be realized without increasing arrangement intervals (pitches) between the plurality of pads PD. This case, for example, offers an advantage that the technical concept of the second embodiment can be realized as an increase in the size of the semiconductor chip is suppressed.

The second means offers an advantage that because the size of the opening OP is maintained, the technical concept of the second embodiment can be realized without impairing the connection reliability of the wire W connected to the surface of the pad PD exposed through the opening OP. This case, for example, offers an advantage that the technical concept of the second embodiment can be realized without affecting the reliability of the semiconductor device (particularly, the connection reliability of the wire).

A method of manufacturing the semiconductor device according to the second embodiment is basically the same as the method of manufacturing the semiconductor device according to the first embodiment. According to the method of manufacturing the semiconductor device according to the second embodiment, however, in the process of forming the opening OP exposing a part of the surface of each of the plurality of pads PD on the surface protective film PAS, the patterning by photolithography and etching is carried out in a different way. Specifically, the patterning of the opening OP is carried out so that the central position of the opening OP is shifted in an inward direction (central direction) of the chip region relative to the central position of each of the plurality of pads PD. In other words, the patterning of the opening OP is carried out so that the width of the coating area CRV2 of the surface protective film PAS that covers the side closest to the boundary among a plurality of sides making up each of the plurality of pads PD becomes larger than the width of the coating area CRV1 of the surface protective film PAS that covers the side farthest to the boundary.

The patterning of the opening OP according to the second embodiment is carried out so that at the pad PD1 closest to the corner CNR of the chip region among the plurality of pads PD, the width of the coating area CRV3 of the surface protective film PAS that covers the side closest to the corner CNR of the chip region among the plurality of sides making up the pad PD1 also becomes larger than the width of the coating area CRV1 of the surface protective film PAS that covers the side farthest to the boundary.

Third Embodiment

In the first and second embodiments, the configuration example in which the plurality of pads PD are arranged into a single row along the edge sides ES of the semiconductor chip CHP has been described. A third embodiment relates to a configuration example in which the plurality of pads PD are arranged into a plurality of rows (e.g., two rows) along the edge sides ES of the semiconductor chip CHP.

FIG. 23 is an enlarged plan view of a part of the semiconductor chip CHP according to the third embodiment. In FIG. 23, the plurality of pads are arranged into two rows along the edge sides ES of the semiconductor chip CHP. Specifically, the plurality of pads include a plurality of outer pads OPD arranged closer to the edge sides ES of the semiconductor chip CHP along the edge sides ES, and a plurality of inner pads IPD arranged farther to the edge sides ES of the semiconductor chip CHP along the edge sides ES. For example, FIG. 23 illustrates a case where two rows of the outer pads OPD and inner pads IPD are arranged into so-called zigzag formation. In FIG. 23, the outer pads OPD are arranged into a first row closer to the edge sides ES while the inner pads IPD are arranged into a second row farther to the edge sides ES.

As shown in FIG. 23, at each of the plurality of inner pads IPD, the lead-out wiring portion DWU is provided so as to be connected to the side closest to the edge side ES of the semiconductor chip CHP among the plurality of sides making up each of the plurality of inner pads IPD, and slopes SLP (IN) are provided on the connecting parts between each of the plurality of inner pads IPD and the lead-out wiring portion DWU.

At each of the plurality of outer pads OPD, in contrast, the lead-out wiring portion DWU is provided so as to be connected to the side farthest to the edge side ES of the semiconductor chip CHP among the plurality of sides making up each of the plurality of outer pads OPD, and slopes SLP (OUT) are formed on the connecting parts between each of the plurality of outer pads OPD and the lead-out wiring portion DWU.

For example, the sloped portions SLP (IN) provided integrally with the inner pad IPD are identical in shape and size with the sloped portions SLP (OUT) provided integrally with the outer pad OPD.

In this manner, according to the third embodiment, at each of the outer pads OPD and inner pads IPD arranged into zigzag formation, the sloped portions SLP (OUT) or sloped portions SLP (IN) are provided on the connecting parts between the pad and the lead-out wiring portion DWU. As a result, according to the third embodiment, crack formation on the coating area where a part of the outer pad OPD is covered with the surface protective film PAS and on the coating area where a part of the inner pad IPD is covered with the surface protective film PAS can be suppressed. In other words, the technical concept described in the first embodiment can be applied not only to the plurality of pads PD arranged into a single row but also to the inner pads IPD and outer pads OPD arranged into, for example, a plurality of rows such as zigzag formation according to the third embodiment.

<First Modification>

In the third embodiment, the case where the sloped portions SLP (IN) provided integrally with the inner pad IPD are identical in shape and size with the sloped portions SLP (OUT) provided integrally with the outer pad OPD, as shown in FIG. 23, has been described. A first modification relates to a case where the sloped portions SLP (IN) are different in size from the sloped portions SLP (OUT).

FIG. 24 is an enlarged plan view of a part of the semiconductor chip CHP according to the first modification. As shown in FIG. 24, according to the first modification, the size (area) of the sloped portions SLP (IN) provided integrally with the inner pad IPD is larger than the size (area) of the sloped portions SLP (OUT) provided integrally with the outer pad OPD. To put it another way, the sloped portions SLP (OUT) provided integrally with the outer pad OPD is smaller in size than the sloped portions SLP (IN) provided integrally with the inner pad IPD.

The reasons for this configuration will hereinafter be described. The examination by the inventor has revealed that a stress applied to the coating area covering the side closest to the edge side ES of the semiconductor chip CHP among the plurality of sides making up the pad tends to become relatively large. Based on this knowledge, by paying attention to the inner pad IPD shown FIG. 24, it is found that the inner pad IPD is provided with the lead-out wiring portion DWU disposed on the side closest to the edge side ES of the semiconductor chip CHP among the plurality of sides making up the inner pad IPD. At the inner pad IPD, therefore, the connecting parts between the inner pad IPD and the lead-out wiring portion DWU are present on the side closest to the edge side ES of the semiconductor chip CHP, on the side where a stress tends to become larger. This means that at the inner pad IPD, the connecting parts between the inner pad IPD and the lead-out wiring portion DWU are present in the place where a stress becomes relatively large, in which case a crack is easily formed in the coating area of the surface protective film PAS that covers the connecting parts. According to the first modification, to sufficiently suppress crack formation on the connecting parts between the inner pad IPD and the lead-out wiring portion DWU, the sloped portions SLP (IN) of a large size are provided on the connecting parts. It is presumed that the sloped portions SLP (IN) of a larger size suppresses crack formation on the connecting parts between the inner pad IPD and the lead-out wiring portion DWU more effectively. For this reason, the sloped portions SLP (IN) of a large size are formed on the connecting parts between the inner pad IPD and the lead-out wiring portion DWU. Hence, even when a relatively large stress is applied to the connecting parts between the inner pad IPD and the lead-out wiring portion DWU, crack formation on the connecting parts can be suppressed sufficiently.

By paying attention to the outer pad OPD shown FIG. 24, it is found that the outer pad OPD is provided with the lead-out wiring portion DWU disposed on the side farthest to the edge side ES of the semiconductor chip CHP among the plurality of sides making up the outer pad OPD. At the outer pad OPD, therefore, the connecting parts between the outer pad OPD and the lead-out wiring portion DWU are present on the side farthest to the edge side ES of the semiconductor chip CHP, on the side where a stress is unlikely to become relatively larger. This means that at the outer pad IPD, the connecting parts between the outer pad OPD and the lead-out wiring portion DWU are present in the place where a stress hardly becomes large, in which case a crack is hardly formed in the coating area of the surface protective film PAS that covers the connecting parts. According to the first modification, in view of the fact that crack formation on the connecting parts between the outer pad OPD and the lead-out wiring portion DWU is less problematic than crack formation on the connecting parts between the inner pad IPD and the lead-out wiring portion DWU, the sloped portions SLP (OUT) of a small size are formed on the connecting parts between the outer pad OPD and the lead-out wiring portion DWU. It is presumed that the sloped portions SLP (OUT) of a small size can suppress crack formation on the connecting parts between the outer pad OPD and the lead-out wiring portion DWU. For this reason, the sloped portions SLP (OUT) of a small size are formed on the connecting parts between the outer pad OPD and the lead-out wiring portion DWU. Hence, the first modification realizes the configuration in which the sloped portions SLP (IN) provided integrally with the inner pad IPD is larger in size than the sloped portions SLP (OUT) provided integrally with the outer pad OPD. In this configuration, crack formation on the connecting parts between the inner pad IPD and the lead-out wiring portion DWU can be suppressed and crack formation on the connecting parts between the outer pad OPD and the lead-out wiring portion DWU can also be suppressed.

<Second Modification>

A second modification relates to a case where the sloped portions SLP (IN) are provided integrally with the inner pad IPD while no sloped portion is provided on the connecting parts between the outer pad OPD and the lead-out wiring portion DWU.

FIG. 25 is an enlarged plan view of apart of the semiconductor chip CHP according to the second modification. For example, as described in the first embodiment, the outer pad OPD is provided with the lead-out wiring portion DWU disposed on the side farthest to the edge side ES of the semiconductor chip CHP among the plurality of sides making up the outer pad OPD. It is presumed in this case that at the outer pad OPD, a stress applied to the connecting parts between the outer pad OPD and the lead-out wiring portion DWU is relatively small and therefore a crack is hardly formed on the coating area of the surface protective film PAS that covers the connecting parts. According to the second modification, by further taking into consideration the fact that crack formation on the connecting parts between the outer pad OPD and the lead-out wiring portion DWU is less problematic than crack formation on the connecting parts between the inner pad IPD and the lead-out wiring portion DWU, no sloped portion is formed on the connecting parts between the outer pad OPD and the lead-out wiring portion DWU. In this configuration of the second modification, because the sloped portions SLP (IN) are provided integrally with the inner pad IPD, crack formation on the connecting parts between the inner pad IPD and the lead-out wiring portion DWU can be suppressed sufficiently.

Fourth Embodiment

On the assumption that a case where the plurality of pads are arranged into zigzag formation along the edge sides ES of the semiconductor chip CHP is a prerequisite configuration, as in the third embodiment, a fourth embodiment relates to a technical concept that further provides an idea for dealing with the second factor that a crack is formed easily on the surface protective film PAS due to the small width of the coating area of the pad covered with the surface protective film PAS.

FIG. 26 is an enlarged plan view of apart of the semiconductor chip CHP according to the fourth embodiment. As shown in FIG. 26, according to the fourth embodiment in which the pads are arranged into zigzag formation as the prerequisite configuration, at each of the plurality of inner pads IPD making up the pads arranged into zigzag formation, the central position of the opening OP matches the central position of each of the plurality of inner pads IPD. At each of the plurality of outer pads OPD making up the pads arranged into zigzag formation, in contrast, the central position of the opening OP is shifted toward in an inward direction (central direction) of the semiconductor chip CHP, relative to the central position of each of the plurality of outer pads OPD.

As a result, as shown in FIG. 26, the width of the coating area CRV2 of the surface protective film PAS that covers the side closest to the edge side ES of the semiconductor chip CHP among the plurality of sides making up each of the plurality of outer pads OPD is made larger than the width of the coating area CRV1 of the surface protective film PAS that covers the side farthest to the edge side ES of the semiconductor chip CHP. This means that the width (in the Y direction) of the coating area CRV2 covering the side (side closest to the edge side ES of the semiconductor chip CHP) most likely to be subjected to a stress caused by the swell and shrinkage of the resin (not illustrated) due to a temperature change among the plurality of sides making up the outer pad OPD can be increased relatively. Since relatively increasing the width (in the Y direction) of the coating area CRV2 means improving the crack resistance of the coating area CRV2 to a stress, according to the semiconductor device of the fourth embodiment, at the outer pad OPD, crack formation on the coating area CRV2 of the surface protective film PAS that covers the side closest to the edge side ES of the semiconductor chip CHP can be suppressed. According to the fourth embodiment, in the same manner as in the third embodiment, crack formation on the connecting parts can be suppressed by forming the sloped portions SLP (OUT) on the connecting parts between the outer pad OPD and the lead-out wiring portion DWU and the sloped portions SLP (IN) on the connecting parts between the inner pad IPD and the lead-out wiring portion DWU. According to the fourth embodiment, because the width (in the Y direction) of the coating area CRV2 of the outer pad OPD can be increased relatively, as shown in FIG. 26, crack formation on the coating area CRV2 of the surface protective film PAS that covers the side closest to the edge side ES of the semiconductor chip CHP can also be suppressed.

As shown in FIG. 26, in the fourth embodiment, attention is paid to an outer pad OPD1 closest to the corner CNR of the semiconductor chip CHP among the plurality of outer pads OPD. Specifically, as shown in FIG. 26, at the outer pad OPD1 closest to the corner CNR of the semiconductor chip CHP, the width of the coating area CRV3 of the surface protective film PAS that covers the side closest to the corner of the semiconductor chip CHP among the plurality of sides making up the outer pad OPD1 is also made larger than the width of the coating area CRV1 of the surface protective film PAS that covers the side farthest to the edge side ES of the semiconductor chip CHP.

As a result, according to the fourth embodiment, at the outer pad OPD1 closest to the corner CNR of the semiconductor chip CHP, the width (in the Y direction) of the coating area CRV2 covering the side (side closest to the edge side ES of the semiconductor chip CHP) where a stress caused by the swell and shrinkage of the resin (not illustrated) due to a temperature change tends to become larger can be increased relatively. In addition, according to the fourth embodiment, the width of the coating area CRV3 covering the side closest to the corner CNR, on the side where a stress tends to become larger, can also be increased relatively. As a result, according to the fourth embodiment, the crack resistance of the outer pad OPD1 disposed closest to the corner CNR of the semiconductor chip CHP is improved particularly.

<Modification>

A modification of the fourth embodiment will then be described. In the fourth embodiment, in which attention is paid to the outer pads OPD, the case of providing the idea for dealing with the second factor that a crack is formed easily on the surface protective film PAS due to the small width of the coating area of the outer pad OPD covered with the surface protective film PAS has been described. This modification, in which attention is turned also to the inner pads IPD, relates to a case where the idea for dealing with the second factor is applied also to the inner pads IPD. In the fourth embodiment, because of a presumption that the above second factor develops into a real problem at the outer pads OPD closest to the edge side ES of the semiconductor chip CHP, the case of applying the idea for dealing with the second factor to the outer pads OPD has been described. In this modification, although the inner pads IPD, which are more distant from the edge side ES of the semiconductor chip CHP than the outer pads OPD, are presumed to be less affected by the second factor than the outer pads OPD is, a possibility of the inner pads IPD being affected by the second factor is still taken into consideration. In other words, according to this modification, to further improve the reliability of the semiconductor device, the idea for dealing with the second factor is also applied to the inner pads IPD.

FIG. 27 is an enlarged plan view of apart of the semiconductor chip CHP according to this modification. As shown in FIG. 27, according to this modification in which the pads are arranged into zigzag formation as a prerequisite configuration, at each of the plurality of outer pads OPD as well as inner pads IPD making up the pads arranged into zigzag formation, the central position of the opening OP is shifted in an inward direction (central direction) of the semiconductor chip CHP, relative to the central position of each of the plurality of inner pads IPD.

As a result, as shown in FIG. 27, the width of the coating area CRV2 of the surface protective film PAS that covers the side closest to the edge side ES of the semiconductor chip CHP among the plurality of sides making up each of the plurality of inner pads IPD is made larger than the width of the coating area CRV1 of the surface protective film PAS that covers the side farthest to the edge side ES of the semiconductor chip CHP. This means that the width (in the Y direction) of the coating area CRV2 covering the side (side closest to the edge side ES of the semiconductor chip CHP) most likely to be subjected to a stress caused by the swell and shrinkage of the resin (not illustrated) due to a temperature change among the plurality of sides making up the inner pad IPD can be increased relatively. Since relatively increasing the width (in the Y direction) of the coating area CRV2 means improving the crack resistance of the coating area CRV2 to a stress, according to the semiconductor device of this modification, at the inner pad IPD, crack formation on the coating area CRV2 of the surface protective film PAS that covers the side closest to the edge side ES of the semiconductor chip CHP can be suppressed.

As shown in FIG. 27, in this modification, attention is paid to an inner pad IPD1 closest to the corner CNR of the semiconductor chip CHP among the plurality of inner pads IPD. Specifically, as shown in FIG. 27, at the inner pad IPD1 closest to the corner CNR of the semiconductor chip CHP, the width of the coating area CRV3 of the surface protective film PAS that covers the side closest to the corner of the semiconductor chip CHP among the plurality of sides making up the inner pad IPD1 is also made larger than the width of the coating area CRV1 of the surface protective film PAS that covers the side farthest to the edge side ES of the semiconductor chip CHP.

As a result, according to the this modification, at the inner pad IPD1 closest to the corner CNR of the semiconductor chip CHP, the width (in the Y direction) of the coating area CRV2 covering the side (side closest to the edge side ES of the semiconductor chip CHP) where a stress caused by the swell and shrinkage of the resin (not illustrated) due to a temperature change tends to become larger can be increased relatively. In addition, according to this modification, the width of the coating area CRV3 covering the side closest to the corner CNR, on the side where a stress tends to become larger, can also be increased relatively. As a result, according to this modification, the crack resistance of the inner pad IPD1 disposed closest to the corner CNR of the semiconductor chip CHP is improved particularly.

In this manner, according to this modification, the idea for dealing with the second factor is applied not only to the outer pads OPD, but also to the inner pads IPD. As a result, according to this modification, at the plurality of outer pads OPD as well as inner pads IPD arranged into zigzag formation, their crack resistance against the first and second factors can be improved, which further improves the reliability of the semiconductor device.

Fifth Embodiment

A fifth embodiment relates to a technical concept of providing an idea for dealing with the above third factor. The fifth embodiment is, therefore, described as the idea for solving the problem that "aluminum slider", i.e., a shift of a part of the pad PD, and formation of the crack CLK on the surface protective film PAS occur easily because the length (in the X direction) of a line segment (part of one side of the pad PD) perpendicular to the width of the coating area is longer than the width (in the Y direction) of the coating area of the pad PD covered with the surface protective film PAS.

FIG. 28 is a plan view schematically showing a configuration of the pad PD according to a fifth embodiment. In FIG. 28, the lead-out wiring portion DWU is provided integrally with the pad PD. The lead-out wiring portion DWU is provided such that the width (in the X direction) of the lead-out wiring portion DWU is smaller than the length of a side to which the lead-out wiring portion DWU is connected among the plurality of sides making up the pad PD and that the central position of the width of the lead-out wiring portion DWU is shifted relative to the central position of the side to which the lead-out wiring portion DWU is connected among the plurality of sides making up the pad PD.

At the pad PD of the fifth embodiment configured in such a manner, as shown in FIG. 28, on one side of the lead-out wiring portion DWU, the length of a line segment not in contact with the lead-out wiring portion DWU and making up a part of the side to which the lead-out wiring portion DWU is connected is larger (longer line segment side on the left of the lead-out wiring portion DWU of FIG. 28). On the other side of the lead-out wiring portion DWU, the length of a line segment not in contact with the lead-out wiring portion DWU and making up a part of the side to which the lead-out wiring portion DWU is connected is smaller (shorter line segment side on the right of the lead-out wiring portion DWU of FIG. 28).

At the pad PD of the fifth embodiment configured in such a manner, the side warps more heavily on the longer line segment side because of the swell and shrinkage of the resin (not illustrated) due to a temperature change. This increases a possibility of the formation of "aluminum slide" and cracking on the longer line segment side.

According to the fifth embodiment in which sloped portions are provided on both sides of the lead-out wiring portion DWU, a sloped portion SLP1 provided on one side (longer line segment side) of the lead-out wiring portion DWU is made asymmetric in shape with a sloped portion SLP2 provided on the other side (shorter line segment side) of the lead-out wiring portion DWU.

Specifically, as shown in FIG. 28, the sloped portion SLP1 provided on one side (longer line segment side) of the lead-out wiring portion DWU is larger in size than the sloped portion SLP2 provided on the other side (shorter line segment side) of the lead-out wiring portion DWU. For example, as shown in FIG. 28, the sloped portion SLP1 formed on one side (longer line segment side) of the lead-out wiring portion DWU is of a trapezoid, while the sloped portion SLP2 formed on the other side (shorter line segment side) of the lead-out wiring portion DWU is of a triangle.

In this manner, because of the larger size of the sloped portion SLP formed on the long line segment side on which the side is likely to warp more heavily, warping on the long line segment side is suppressed. As a result, according to the fifth embodiment, the formation of "aluminum slide" and cracking caused by warping on the long line segment side can be suppressed effectively.

An examination by the inventor has led to a finding that when $b1/a1<3$ is satisfied, as shown in FIG. 28, where a1 denotes the width (in the Y direction) of the coating area of the surface protective film PAS that covers the side to which the lead-out wiring portion DWU is connected among the plurality of sides making up the pad PD and b1 denotes the width (in the X direction) of the coating area of the surface protective film PAS, a warp of the side of the pad PD caused by a stress due to the swell and shrinkage of the resin can be suppressed sufficiently. For the same reason, it is also preferable that $b2/a2<3$ be satisfied, where a2 denotes the height (in the Y direction) of the sloped portion SLP1 as the trapezoid and b2 denotes the length of the bottom side of the sloped portion SLP1 as the trapezoid. It is more preferable that $(b2/a2)+(b1/a1))<3$ be satisfied.

<First Modification>

As described in the fifth embodiment, in view of the necessity of preventing the formation of "aluminum slide" and cracking caused by warping on the long line segment side, it is preferable to make the sloped portion SLP1 provided on one side (longer line segment side) of the lead-out wiring portion DWU larger in size than the sloped portion SLP2 provided on the other side (shorter line segment side) of the lead-out wiring portion DWU.

However, shaping the sloped portion SLP1 into a trapezoid and the sloped portion SLP2 into a triangle is merely one example. For example, as shown in FIG. 29, the sloped portion SLP1 formed on one side (longer line segment side) of the lead-out wiring portion DWU may be shaped into a first triangle and the sloped portion SLP2 formed on the other side (shorter line segment side) of the lead-out wiring portion DWU may be shaped into a second triangle.

In such a case, in view of the necessity of surely preventing the formation of "aluminum slide" and cracking caused by warping on the longer line segment side, it is preferable that $b1/a1<3$ be satisfied, where a1 denotes the width (in the Y direction) of the coating area of the surface protective film PAS that covers the side to which the lead-out wiring portion DWU is connected among the plurality of sides making up the pad PD and b1 denotes the width (in the X direction) of the coating area of the surface protective film PAS. For the same reason, it is also preferable that $b2/a2<3$ be satisfied, where a2 denotes the height (in the Y direction) of the sloped portion SLP1 as the first triangle and b2 denotes the length (in the X direction) of the bottom side of the sloped portion SLP1 as the first triangle. It is more preferable that $(b2/a2)+(b1/a1)<3$ be satisfied.

<Second Modification>

The techniques disclosed referring to FIGS. 28 and 29 may be applied to the configurations of FIGS. 23, 24, and 25 described in the third embodiment. Specifically, the above sloped portions SLP1 and SLP2 may be formed on the first and second rows of pads arranged into zigzag formation, as in the case of FIG. 23. The sloped portions SLP1 and SLP2 formed on the pads on the second row of the zigzag formation may be made larger than the sloped portions SLP1 and SLP2 formed on the pads on the first row of the zigzag formation, as in the case of FIG. 24. The sloped portions SLP1 and SLP2 may be formed only on the pads on the second row of the zigzag formation and not formed on the pads on the first row, as in the case of FIG. 25. The techniques disclosed referring to FIGS. 28 and 29 may be applied to the configuration of the above fourth embodiment.

Sixth Embodiment

On the assumption that the presence of a plurality of lead-out wiring portions DWU provided integrally with the pad PD is a prerequisite configuration, a sixth embodiment relates to a case where a technical concept of providing an idea for dealing with the first factor is applied to this prerequisite configuration.

FIG. 30 is an enlarged plan view of a part of the semiconductor chip CHP according to the sixth embodiment. In FIG. 30, for example, among the plurality of outer pads OPD and inner pads IPD arranged into zigzag formation, an outer pad OPD2 included in the row of outer pads OPD is provided with a lead-out wiring portion DWU1 and a lead-out wiring portion DWU2 that are provided integrally with the outer pad OPD2. This is an example of a layout adopted for ensuring a sufficient amount of current flowing through the outer pad OPD2. For example, when current flowing through the outer pad OPD2 is so large that the single lead-out wiring portion DWU1 cannot handle current inflow to the outer pad OPD2, the lead-out wiring portions DWU1 and DWU2 are provided integrally with the outer pad OPD2 in order to handle large current inflow. The lead-out wiring portion DWU2 has a contact (not illustrated) connected to a lower-layer wiring as the lead-out wiring portion DWU1 does and is therefore connected electrically to field-effect transistors Q disposed in the integrated circuit region.

Such a lead-out wiring portion DWU2 is effective in terms of reducing a chip area when no space for disposing a pad exists between two outer pads OPD or two pads OPD having the same functions related to power supply, etc., need to be lined up next to each other.

Specifically, as shown in FIG. 30, the outer pad OPD2 is of an oblong, and the plurality of lead-out wiring portions connected to the outer pad OPD2 are made up of the lead-out wiring portion DWU1 connected to a short side of the outer pad OPD2 and the lead-out wiring portion DWU2 connected to a long side of the outer pad OPD2. In this case, the sloped portions SLP (OUT) are provided on the connecting parts between the outer pad OPD2 and the lead-out wiring portion DWU1 and are also provided on the connecting parts between the outer pad OPD2 and the lead-out wiring portion DWU2.

At the outer pad OPD2 of the sixth embodiment configured in such a manner, crack formation can be suppressed on the connecting parts between the outer pad OPD2 and the lead-out wiring portion DWU1 as well as on the connecting parts between the outer pad OPD2 and the lead-out wiring portion DWU2.

While the case of forming both lead-out wiring portions DWU1 and DWU2 on the outer pad OPD2 is described in the sixth embodiment, this is not the only case. For example, the same effect as described above is achieved even in the case of forming only the lead-out wiring portion DWU2 on the outer pad OPD2.

While the case of zigzag arrangement of the pads is described in the sixth embodiment, the technical concept of the sixth embodiment can be applied also to the case where the pads are arranged into a single row as in the first and second embodiments. In other words, the technique disclosed in the sixth embodiment can be applied also to the above first to fifth embodiments.

Seventh Embodiment

A seventh embodiment relates to a case where the position of the opening of the silicon nitride film SNF making up the surface protective film PAS shown in FIG. 11 is changed.

Figure 32:
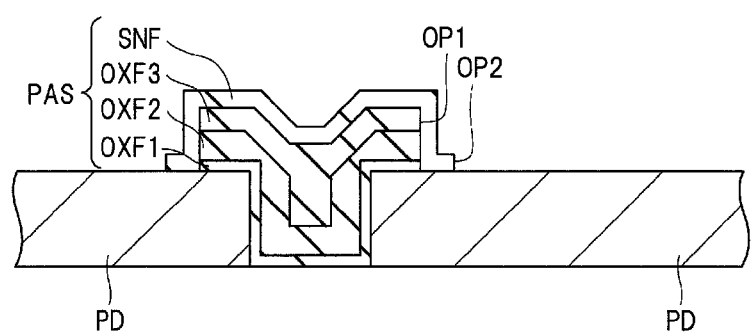

FIG. 31 is a plan view of the pad PD, and FIG. 32 is a sectional view of the pad PD. According to the seventh embodiment, the silicon oxide films OXF1, OXF2, and OXF3 are formed and then patterning using a photoresist film as a mask is performed to form an opening OP1. The barrier conductive film BCF2 is also etched in the same process, as a result of which the aluminum film AF is exposed through the opening OP1. Subsequently, the silicon nitride film SNF is formed and is patterned separately to form an opening OP2 inside the opening OP1.

According to the seventh embodiment, in the opening OP1, the side faces of the silicon oxide films OXF1, OXF2, and OXF3 and barrier conductive film BCF2 can be covered with the silicon nitride film SNF. When the barrier conductive film BCF2 is made of titanium nitride, therefore, oxidation of the titanium nitride is prevented. Oxidation of the titanium nitride increases its volume, and the more voluminous titanium nitride applies a stress to the surface protective film PAS overlaid on the titanium nitride. This raises a concern that a crack is easily formed on the silicon nitride film SNF. To eliminate this concern, according to the seventh embodiment, the side face of the barrier conductive film BCF2 is covered with the silicon nitride film SNF, in which case crack formation is prevented further effectively.

The technique disclosed in the seventh embodiment can obviously be applied to the above first to sixth embodiments, in which case the opening OP2 of the seventh embodiment is equivalent to the opening OP of the first to sixth embodiments.

In the foregoing, the invention made by the inventors of the present invention has been concretely described based on the embodiments. However, it is needless to say that the present invention is not limited to the foregoing embodiments and various modifications and alterations can be made within the scope of the present invention.

The above embodiments include the following embodiments.

(Note 1)
A semiconductor device comprising a rectangular semiconductor chip,
wherein the semiconductor chip includes:
(a) a plurality of pads arranged along an edge side of the semiconductor chip;
(b) a lead-out wiring portion provided on each of the plurality of pads; and (c) a sloped portion provided on a connecting part between each of the plurality of pads and the lead-out wiring portion,
wherein a width of the lead-out wiring portion is smaller than a length of aside to which the lead-out wiring portion is connected among a plurality of sides making up each of the plurality of pads,
a central position of the width of the lead-out wiring portion is shifted relative to a central position of the side to which the lead-out wiring portion is connected among the plurality of sides making up each of the plurality of pads.

(Note 2)
The semiconductor device according to note 1,
wherein the sloped portions are provided on both sides of the lead-out wiring portion, respectively.

(Note 3)
The semiconductor device according to note 2,
wherein the sloped portion formed on one side of the lead-out wiring portion is asymmetric in shape with the sloped portion formed on the other side of the lead-out wiring portion.

(Note 4)
The semiconductor device according to note 3,
wherein on one side of the lead-out wiring portion, a length of a line segment not in contact with the lead-out wiring portion and making up a part of a side to which the lead-out wiring portion is connected is larger,
on the other side of the lead-out wiring portion, a length of a line segment not in contact with the lead-out wiring portion and making up a part of the side to which the lead-out wiring portion is connected is smaller, and
the sloped portion provided on the one side of the lead-out wiring portion is larger in size than the sloped portion provided on the other side of the lead-out wiring portion.

(Note 5)
The semiconductor device according to note 4,
wherein the sloped portion provided on one side of the lead-out wiring portion is of a trapezoid, while the sloped portion provided on the other side of the lead-out wiring portion is of a triangle.

(Note 6)
The semiconductor device according to note 5, comprising:
(d) a surface protective film covering each of the plurality of pads, the lead-out wiring portion, and the sloped portion,
wherein the surface protective film has an opening that exposes a part of a surface of each of the plurality of pads, and
$b2/a2<3$ is satisfied, where a2 denotes a height of the trapezoid and b2 denotes a length of a bottom side of the trapezoid.

(Note 7)
The semiconductor device according to note 4,
wherein the sloped portion provided on one side of the lead-out wiring portion is of a first triangle and the sloped portion provided on the other side of the lead-out wiring portion is of a second triangle.

(Note 8)
The semiconductor device according to note 7, comprising:
(d) a surface protective film covering each of the plurality of pads, the lead-out wiring portion, and the sloped portion,
wherein the surface protective film has an opening that exposes a part of a surface of each of the plurality of pads, and
$b2/a2<3$ is satisfied, where a2 denotes a height of the first triangle and b2 denotes a length of a bottom side of the first triangle.

(Note 9)

A semiconductor device comprising a rectangular semiconductor chip, the semiconductor chip includes:
(a) a plurality of pads arranged along an edge side of the semiconductor chip;
(b) a lead-out wiring portion provided on each of the plurality of pads; and
(c) a sloped portion provided on a connecting part between each of the plurality of pads and the lead-out wiring portion, wherein a plurality of lead-out wiring portions are connected to a first pad among the plurality of pads, and the sloped portion is provided on each of connecting parts of each of the plurality of lead-out wiring portions connected to the first pad.

(Note 10)

The semiconductor device according to note 9, wherein each of the plurality of pads is of an oblong, and the plurality of lead-out wiring portions connected to the first pad include a first lead-out wiring portion connected to a short side of the first pad and a second lead-out wiring portion connected to a long side of the first pad.

(Note 11)

A method of manufacturing a semiconductor device, comprising:
(a) a step of preparing a semiconductor substrate having rectangular chip regions and a scribe region demarcating the chip regions; and
(b) a step of forming a plurality of rectangular pads, a lead-out wiring portion provided on each of the plurality of pads, and a sloped portion provided on a connecting part between each of the plurality of pads and the lead-out wiring portion, in each of the chip regions along boundaries between the chip regions and the scribe region.

(Note 12)

The method of manufacturing a semiconductor device according to note 11, comprising:
(c) a step of forming a surface protective film covering the plurality of pads, the lead-out wiring portion, and the sloped portion;
(d) a step of forming an opening on the surface protective film, the opening exposing a part of a surface of each of the plurality of pads;
(e) a step of dicing the semiconductor substrate along the scribe region to acquire semiconductor chips, following the step (d);
(f) a step of connecting a wire to a surface of each of the plurality of pads exposed through the opening, following the step (e); and
(g) a step of sealing the semiconductor chips, following the step (f).

(Note 13)

The method of manufacturing a semiconductor device according to note 12, comprising:
a step of conducting a temperature cycle test, following the step (g).

(Note 14)

The method of manufacturing a semiconductor device according to note 12, wherein the opening is formed at the step (d) such that a central position of the opening is shifted toward in an inward direction of the chip region, relative to a central position of each of the plurality of pads.

(Note 15)

The method of manufacturing a semiconductor device according to note 12, wherein the opening is formed at the step (d) such that a width of a coating area of the surface protective film that covers a side closest to the boundary among a plurality of sides making up each of the plurality of pads is made larger than a width of a coating area of the surface protective film that covers a side farthest to the boundary.

(Note 16)

The method of manufacturing a semiconductor device according to note 15, wherein the opening is formed at the step (d) such that at a first pad closest to a corner of the chip region among the plurality of pads, a width of a coating area of the surface protective film that covers a side closest to the corner of the chip region among a plurality of sides making up the first pad is also made larger than a width of a coating area of the surface protective film that covers a side farthest to the boundary.

What is claimed is:

1. A semiconductor device comprising a rectangular semiconductor chip, wherein the semiconductor chip includes:
(a) a plurality of pads arranged along an edge side of the semiconductor chip;
(b) a lead-out wiring portion provided on each of the plurality of pads; and
(c) a sloped portion provided on a connecting part between each of the plurality of pads and the lead-out wiring portion, and
wherein the lead-out wiring portion is connected to a side closest to the edge side of the semiconductor chip among a plurality of sides making up each of the plurality of pads.

2. The semiconductor device according to claim 1,
wherein each of the plurality of pads, the lead-out wiring portion, and the sloped portion are formed integrally together.

3. The semiconductor device according to claim 1,
wherein a width of the lead-out wiring portion is smaller than a length of a side to which the lead-out wiring portion is connected among a plurality of sides making up each of the plurality of pads.

4. The semiconductor device according to claim 3,
wherein the sloped portions are formed on both sides of the lead-out wiring portion, respectively.

5. The semiconductor device according to claim 1, comprising:
(d) a surface protective film covering each of the plurality of pads, the lead-out wiring portion, and the sloped portion,
wherein the surface protective film has an opening that exposes a part of a surface of each of the plurality of pads.

6. A semiconductor device comprising a rectangular semiconductor chip,
wherein the semiconductor chip includes:
(a) a plurality of pads arranged along an edge side of the semiconductor chip;
(b) a lead-out wiring portion provided on each of the plurality of pads;
(c) a sloped portion provided on a connecting part between each of the plurality of pads and the lead-out wiring portion; and
(d) a surface protective film covering each of the plurality of pads, the lead-out wiring portion, and the sloped portion,
wherein the surface protective film has an opening that exposes a part of a surface of each of the plurality of pads, and wherein a central position of the opening is shifted in an inward direction of the semiconductor chip, relative to a central position of each of the plurality of pads.

7. A semiconductor device comprising a rectangular semiconductor chip,
wherein the semiconductor chip includes:
(a) a plurality of pads arranged along an edge side of the semiconductor chip;
(b) a lead-out wiring portion provided on each of the plurality of pads;
(c) a sloped portion provided on a connecting part between each of the plurality of pads and the lead-out wiring portion; and
(d) a surface protective film covering each of the plurality of pads, the lead-out wiring portion, and the sloped portion,
wherein the surface protective film has an opening that exposes a part of a surface of each of the plurality of pads, and
wherein a width of a coating area of the surface protective film that covers a side closest to the edge side of the semiconductor chip among a plurality of sides making up each of the plurality of pads is larger than a width of a coating area of the surface protective film that covers a side farthest to the edge side of the semiconductor chip.

8. The semiconductor device according to claim 7,
wherein at a first pad closest to a corner of the semiconductor chip among the plurality of pads, a width of a coating area of the surface protective film that covers a side closest to the corner of the semiconductor chip among a plurality of sides making up the first pad is also larger than a width of a coating area of the surface protective film that covers a side farthest to the edge side of the semiconductor chip.

9. A semiconductor device comprising a rectangular semiconductor chip,
wherein the semiconductor chip includes:
(a) a plurality of pads arranged along an edge side of the semiconductor chip;
(b) a lead-out wiring portion provided on each of the plurality of pads; and
(c) a sloped portion provided on a connecting part between each of the plurality of pads and the lead-out wiring portion,
wherein the plurality of pads include:
(a1) a plurality of outer pads located closer to the edge side of the semiconductor chip and disposed along the edge side; and
(a2) a plurality of inner pads located farther to the edge side of the semiconductor chip and disposed along the edge side.

10. The semiconductor device according to claim 9,
wherein at the plurality of inner pads, the lead-out wiring portion is provided so as to be connected to a side closest to the edge side of the semiconductor chip among a plurality of sides making up each of the plurality of inner pads, and the sloped portion is provided on a connecting part between each of the plurality of inner pads and the lead-out wiring portion.

11. The semiconductor device according to claim 10,
wherein at the plurality of outer pads, the lead-out wiring portion is provided so as to be connected to a side farthest to the edge side of the semiconductor chip among a plurality of sides making up each of the plurality of outer pads.

12. The semiconductor device according to claim 11,
wherein the sloped portion is not provided on a connecting part between each of the plurality of outer pads and the lead-out wiring portion.

13. The semiconductor device according to claim 11,
wherein the sloped portion is provided on a connecting part between each of the plurality of outer pads and the lead-out wiring portion.

14. The semiconductor device according to claim 13,
wherein the sloped portion provided on a connecting part between each of the plurality of outer pads and the lead-out wiring portion is smaller in size than the sloped portion provided on a connecting part between each of the plurality of inner pads and the lead-out wiring portion.

15. The semiconductor device according to claim 9, comprising:
(d) a surface protective film covering each of the plurality of pads, the lead-out wiring portion, and the sloped portion,
wherein the surface protective film has an opening that exposes a part of a surface of each of the plurality of pads, and
at each of the plurality of outer pads, a central position of the opening is shifted in an inward direction of the semiconductor chip relative to a central position of each of the plurality of outer pads, while at each of the plurality of inner pads, a central position of the opening matches a central position of each of the plurality of inner pads.

16. The semiconductor device according to claim 9, comprising:
(d) a surface protective film covering each of the plurality of pads, the lead-out wiring portion, and the sloped portion,
wherein the surface protective film has an opening that exposes a part of a surface of each of the plurality of pads,
a width of a coating area of the surface protective film that covers a side closest to the edge side of the semiconductor chip among a plurality of sides making up each of the plurality of outer pads is larger than a width of a coating area of the surface protective film that covers a side farthest to the edge side of the semiconductor chip, and
at a first outer pad closest to a corner of the semiconductor chip among the plurality of outer pads, a width of a coating area of the surface protective film that covers a side closest to the corner of the semiconductor chip among a plurality of sides making up the first outer pad is also larger than a width of a coating area of the surface protective film that covers a side farthest to the edge side of the semiconductor chip.

17. The semiconductor device according to claim 16,
wherein a width of a coating area of the surface protective film that covers a side closest to the edge side of the semiconductor chip among a plurality of sides making up each of the plurality of inner pads is larger than a width of a coating area of the surface protective film that covers a side farthest to the edge side of the semiconductor chip, and
at a first inner pad closest to a corner of the semiconductor chip among the plurality of inner pads, a width of a coating area of the surface protective film that covers a side closest to the corner of the semiconductor chip among a plurality of sides making up the first inner pad is also larger than a width of a coating area of the surface protective film that covers a side farthest to the edge side of the semiconductor chip.

* * * * *